(12) United States Patent
Ohashi et al.

(10) Patent No.: US 9,484,249 B1
(45) Date of Patent: Nov. 1, 2016

(54) METHOD OF MANUFACTURING SEMICONDUCTOR DEVICE

(71) Applicant: Hitachi Kokusai Electric Inc., Tokyo (JP)

(72) Inventors: Naofumi Ohashi, Toyama (JP); Satoshi Takano, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/058,718

(22) Filed: Mar. 2, 2016

(30) Foreign Application Priority Data

Jun. 1, 2015 (JP) .................................. 2015-111440

(51) Int. Cl.
*H01L 21/00* (2006.01)
*H01L 21/768* (2006.01)
*H01L 21/66* (2006.01)

(52) U.S. Cl.
CPC ... *H01L 21/76816* (2013.01); *H01L 21/76819* (2013.01); *H01L 21/76843* (2013.01); *H01L 21/76864* (2013.01); *H01L 21/76879* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 6,352,916 B1* | 3/2002 | Tang | ................. | H01L 21/76801 257/E21.576 |
| 6,756,309 B1* | 6/2004 | Chen | ................... | H01L 21/7684 257/E21.583 |
| 7,588,835 B2* | 9/2009 | Yamashita | ................ | C23C 8/02 148/277 |
| 2001/0017422 A1* | 8/2001 | Oda | ................... | H01L 21/76804 257/768 |
| 2002/0102835 A1* | 8/2002 | Stucchi | ............. | H01L 21/76877 438/618 |
| 2007/0037301 A1* | 2/2007 | Jekauc | ..................... | H01L 22/12 438/14 |
| 2007/0082479 A1* | 4/2007 | Padhi | ................ | H01L 21/76819 438/629 |
| 2007/0082490 A1* | 4/2007 | Hu | ......................... | B24B 37/013 438/691 |
| 2007/0215282 A1* | 9/2007 | Itabashi | ............ | H01J 37/32082 156/345.33 |
| 2009/0197355 A1* | 8/2009 | Terahara | ........... | H01L 21/76224 438/14 |
| 2010/0090192 A1* | 4/2010 | Goux | ...................... | B82Y 10/00 257/4 |
| 2013/0244544 A1* | 9/2013 | Wang | ...................... | H01L 22/20 451/41 |
| 2014/0011301 A1* | 1/2014 | Wang | ...................... | H01L 22/12 438/5 |
| 2014/0017824 A1* | 1/2014 | Iizumi | ............... | H01L 21/30625 438/16 |
| 2015/0194619 A1* | 7/2015 | Franklin | ............. | H01L 51/0554 257/29 |

* cited by examiner

*Primary Examiner* — Evren Seven
(74) *Attorney, Agent, or Firm* — Edell, Shapiro & Finnan LLC

(57) ABSTRACT

A technique capable of suppressing a variation in a characteristic of a semiconductor device includes: (a) polishing a substrate including: a first insulating film having a first groove; and a first metal film formed in the first groove and on the first insulating film; (b) forming a second insulating film on the substrate after performing (a); (c) polishing the second insulating film; (d) measuring a thickness distribution of the second insulating film on the substrate after performing (c); and (e) forming a third insulating film having a thickness distribution different from that of the second insulating film measured in (d) to compensate for a thickness distribution of a stacked insulating film including the second insulating film and the third insulating film.

20 Claims, 26 Drawing Sheets

METHOD OF MANUFACTURING SEMICONDUCTOR DEVICE

CROSS REFERENCE TO RELATED APPLICATIONS

This application claims foreign priority under 35 U.S.C. §119(a)-(d) to Application No. JP 2015-111440 filed on Jun. 1, 2015, the entire contents of which are hereby incorporated by reference.

FIELD OF THE INVENTION

The present invention relates to a method of manufacturing a semiconductor device.

BACKGROUND

Recently, semiconductor devices are becoming highly integrated. To this end, multilayer wirings are being realized. The multilayer wirings are formed through a combination of a patterning process, a polishing process, a film processing and the like. In forming the multilayer wirings, it is required that a variation in the characteristics of the semiconductor devices does not occur.

Meanwhile, due to a problem in processing, there are cases where a variation occurs over a distance between circuits formed on a substrate. Specifically, in a multilayer wiring structure, a characteristic of a semiconductor device is significantly affected by the variation.

Therefore, the present invention provides a technique capable of suppressing the variation in the characteristic of the semiconductor device.

SUMMARY

According to an aspect of the present invention, there is provided a technique including: (a) polishing a substrate including: a first insulating film having a first groove; and a first metal film formed in the first groove and on the first insulating film; (b) forming a second insulating film on the substrate after performing the step (a); (c) polishing the second insulating film; (d) measuring a thickness distribution of the second insulating film on the substrate after performing the step (c); and (e) forming a third insulating film having a thickness distribution different from that of the second insulating film measured in the step (d) to compensate for a thickness distribution of a stacked insulating film including the second insulating film and the third insulating film.

DETAILED DESCRIPTION

Hereinafter, an embodiment of the present invention will be described.

Figure 1:
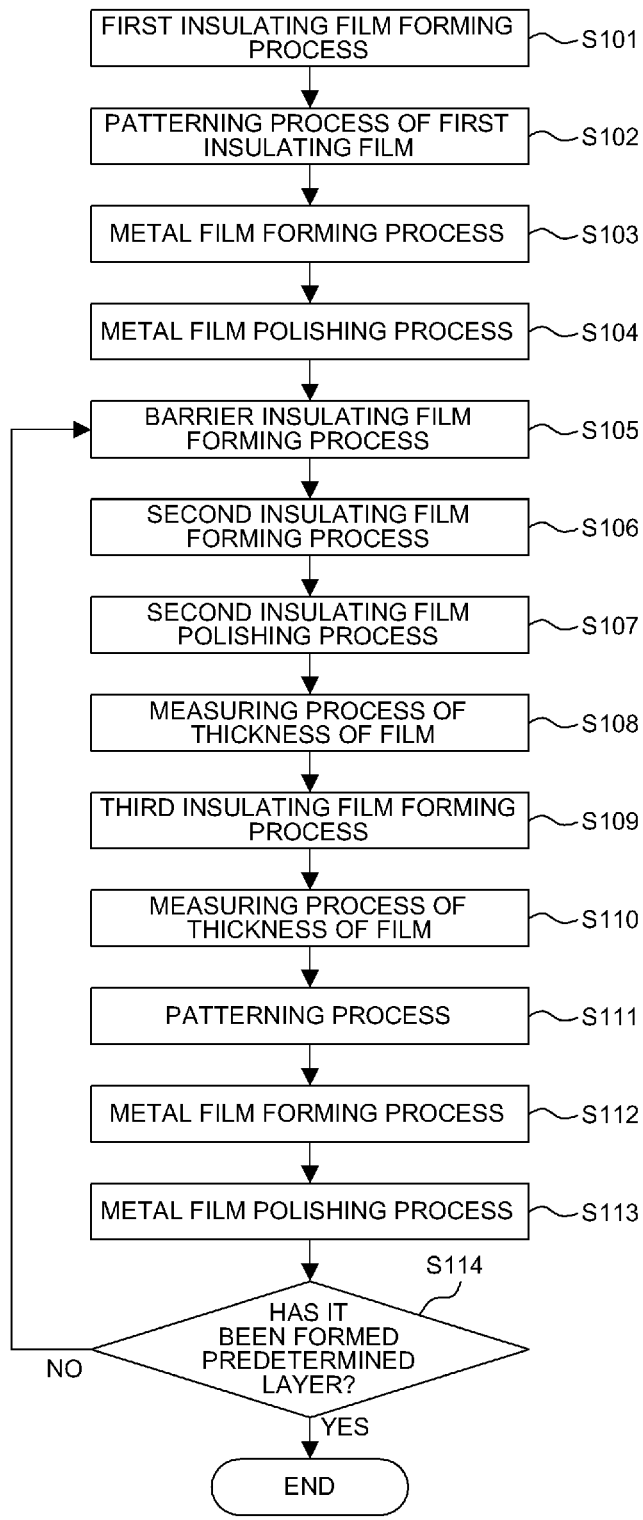
FIG. 1 is a view for describing a manufacturing flow of a semiconductor device according to an embodiment of the present invention.

A process of manufacturing a semiconductor device will be described with reference to FIG. 1.

[First Insulating Film Forming Process (S101)]

Figures 2A, 2B:
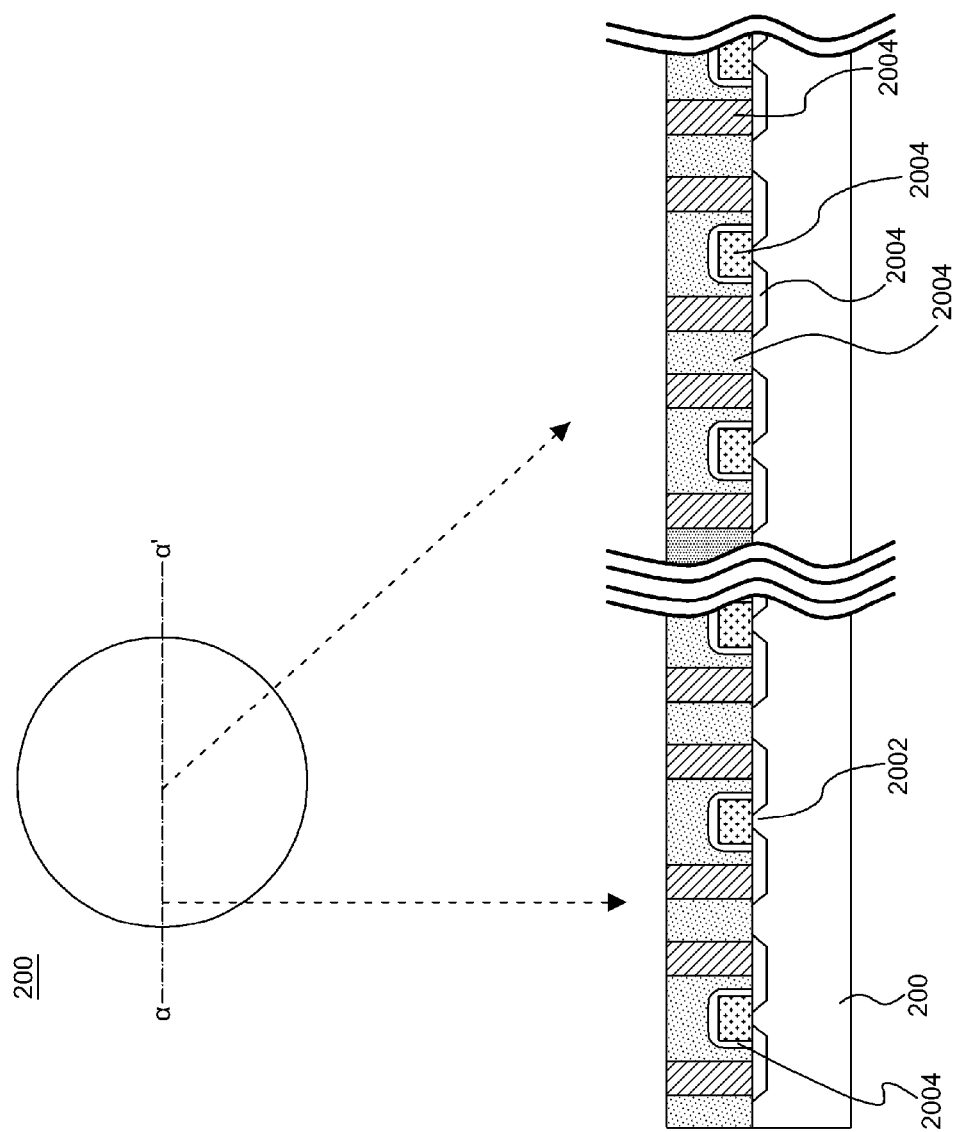
FIGS. 2A and 2B are views for describing a wafer according to the embodiment of the present invention.
Figures 3A, 3B:
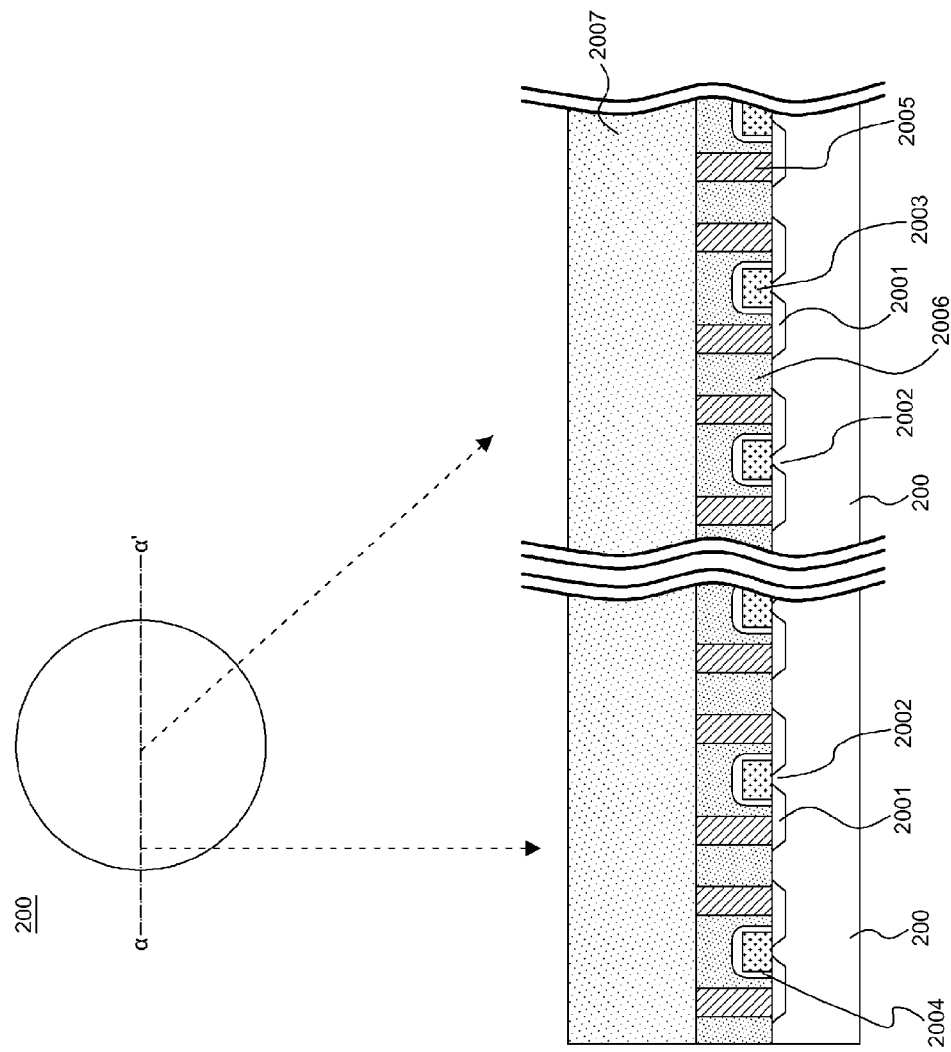
FIGS. 3A and 3B are views for describing a processing state of the wafer according to the embodiment of the present invention.

A first insulating film forming process (S101) will be described. The first insulating film forming process (S101) will be described using a wafer 200 illustrated in FIGS. 2A, 2B, 3A and 3B. FIGS. 2A and 2B illustrate a state of the wafer 200 before an insulating film is formed. FIGS. 3A and 3B illustrate the state of the wafer 200 after the insulating film is formed.

FIG. 2A is a view illustrating the wafer 200 to be processed viewed from a processing surface. FIG. 2B is a cross-sectional view taken along line a-a' of FIG. 2A. In FIG. 2B, a right side of a wavy line represents a center portion of the wafer 200, and a left side thereof represents a periphery of the center portion of the wafer 200.

Source/drain regions 2001 configured as sources or drains are formed on the wafer 200. Channel regions 2002 are formed between the source/drain regions 2001. Gate electrodes 2003 are formed on each of the channel regions 2002. Outer walls 2004 which serve to suppress current leakage from side walls of the gate electrodes 2003 are formed at the periphery of the gate electrode 2003. The source/drain regions 2001 and the gate electrodes 2003 are used as components of a circuit configuration of a semiconductor device. Metal films 2005 serving as plugs are formed in the source/drain regions 2001, and interlayer insulating films 2006, which are, for example, silicon oxide films, are formed between the metal films 2005. The metal film 2005 is formed of, for example, tungsten. The interlayer insulating film 2006 is referred to as a zero insulating film in the present invention according to a relationship with a first interlayer insulating film 2007 to be described later.

Next, the first insulating film forming process (S101) will be described with referent to FIGS. 1, 3A and 3B. When the wafer 200 is loaded into a substrate processing apparatus (a first insulating film forming apparatus) for forming a first insulating film, a silicon-containing gas and an oxygen-containing gas are supplied into a process chamber of the substrate processing apparatus. The supplied gases react with each other in the process chamber, and the first interlayer insulating film 2007 which insulates between metal films 2009 to be described later [referred to simply as an insulating film 2007 or a wiring forming insulating film 2007] is formed. The insulating film 2007 is formed of, for example, a silicon oxide ($SiO_2$) film. The silicon-containing gas is, for example, a tetraethyl orthosilicate [TEOS, $Si(OC_2H_5)_4$] gas, and the oxygen-containing gas is, for example, an oxygen gas ($O_2$). The insulating film 2007 is not limited to the silicon oxide film but may also be a low dielectric constant film (a low-k film) or a silicon oxynitride film.

After a predetermined time has elapsed, when the insulating film 2007 is formed, the wafer 200 is unloaded from the substrate processing apparatus (the first insulating film forming apparatus).

[Patterning Process (S102)]

Figures 4A, 4B:
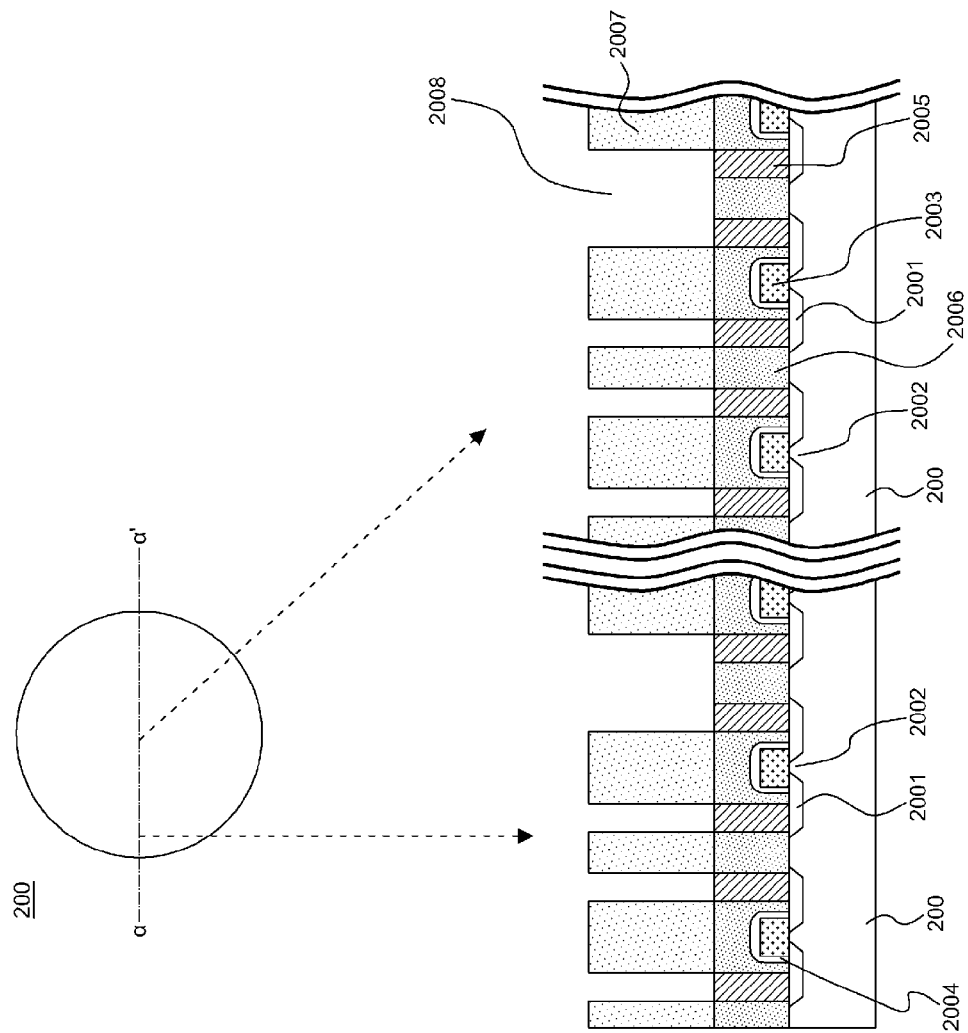
FIGS. 4A and 4B are views for describing the processing state of the wafer according to the embodiment of the present invention.

Next, a patterning process (S102) for patterning the first insulating film 2007 will be described with reference to FIGS. 1, 4A and 4B. FIGS. 4A and 4B are views for describing a state of the wafer 200 after an etching process.

The patterning process (S102) is performed by an exposure apparatus or an etching apparatus which is a component of a first patterning system. The patterning process (S102) includes an exposure process performed by the exposure apparatus, an etching process performed by the etching apparatus and the like. After the wafer 200 loaded into the first patterning system is exposed by the exposure apparatus, a predetermined pattern is formed in the insulating film 2007 by the etching apparatus as illustrated in FIGS. 4A and 4B. Here, wiring grooves 2008 (also referred to as first grooves) are formed. After the etching process is completed, the wafer 200 is unloaded from the etching apparatus and the first patterning system.

[Metal Film Forming Process (S103)]

Next, a metal film forming process (S103) will be described with reference to FIGS. 1, 5A, 5B and 5C. The metal film forming process (S103) is performed by a metal film forming system. The metal film forming system includes a barrier metal film forming apparatus which forms a barrier metal film or a metal film forming apparatus which forms a metal film serving as a wiring. The wafer 200 unloaded from the first patterning system is loaded into the barrier metal film forming apparatus which is one component of the metal film forming system. As illustrated in FIG. 5C, a barrier metal film 2021 is formed on a surface of each of the wiring grooves 2008 by the barrier metal film forming apparatus. The barrier metal film 2021 which suppresses the diffusion of the metal film 2009 to be described later is formed of, for example, titanium nitride (TiN). When the barrier metal film 2021 is formed, the wafer 200 is loaded into the metal film forming apparatus. A conventional plating apparatus or a sputtering apparatus may be used as the metal film forming apparatus. The metal film 2009 (referred to as a wiring metal film) is formed on the barrier metal film 2021 through a plating process or a sputtering process by the metal film forming apparatus. The metal film 2009 is formed of, for example, copper (Cu). The barrier metal film 2021 may also be referred to as a first barrier film in order to be distinguished from a barrier insulating film to be described later.

Figure 5A:
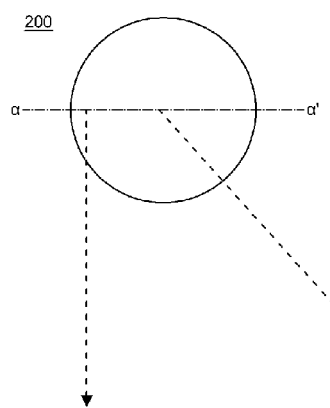
FIGS. 5A, 5B and 5C are views for describing the processing state of the wafer according to the embodiment of the present invention.
Figure 5B:
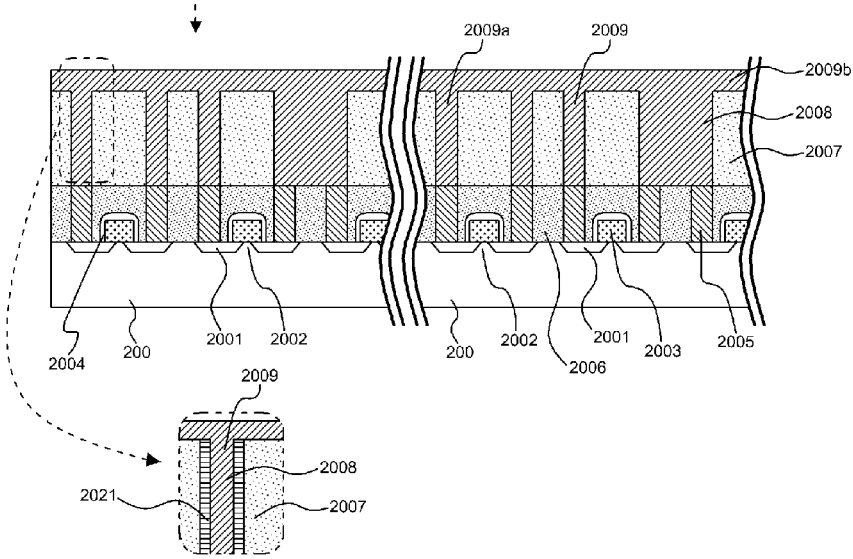
Figure 5C:
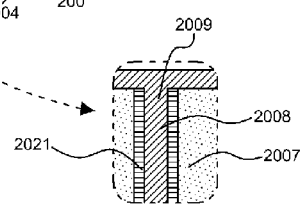

Due to the characteristic of the film forming, the metal film 2009 is formed on the insulating film 2007 as well as the wiring groove 2008 as illustrated in FIGS. 5A, 5B and 5C. Here, the metal film 2009 formed in the wiring grooves 2008 is referred to as a metal film 2009a, and the metal film 2009 formed on the insulating film 2007 is referred to as a metal film 2009b.

When the metal film 2009 is formed in the wiring grooves 2008, the wafer 200 is unloaded from the metal film forming apparatus.

[Metal Film Polishing Process (S104)]

Figures 6A, 6B:
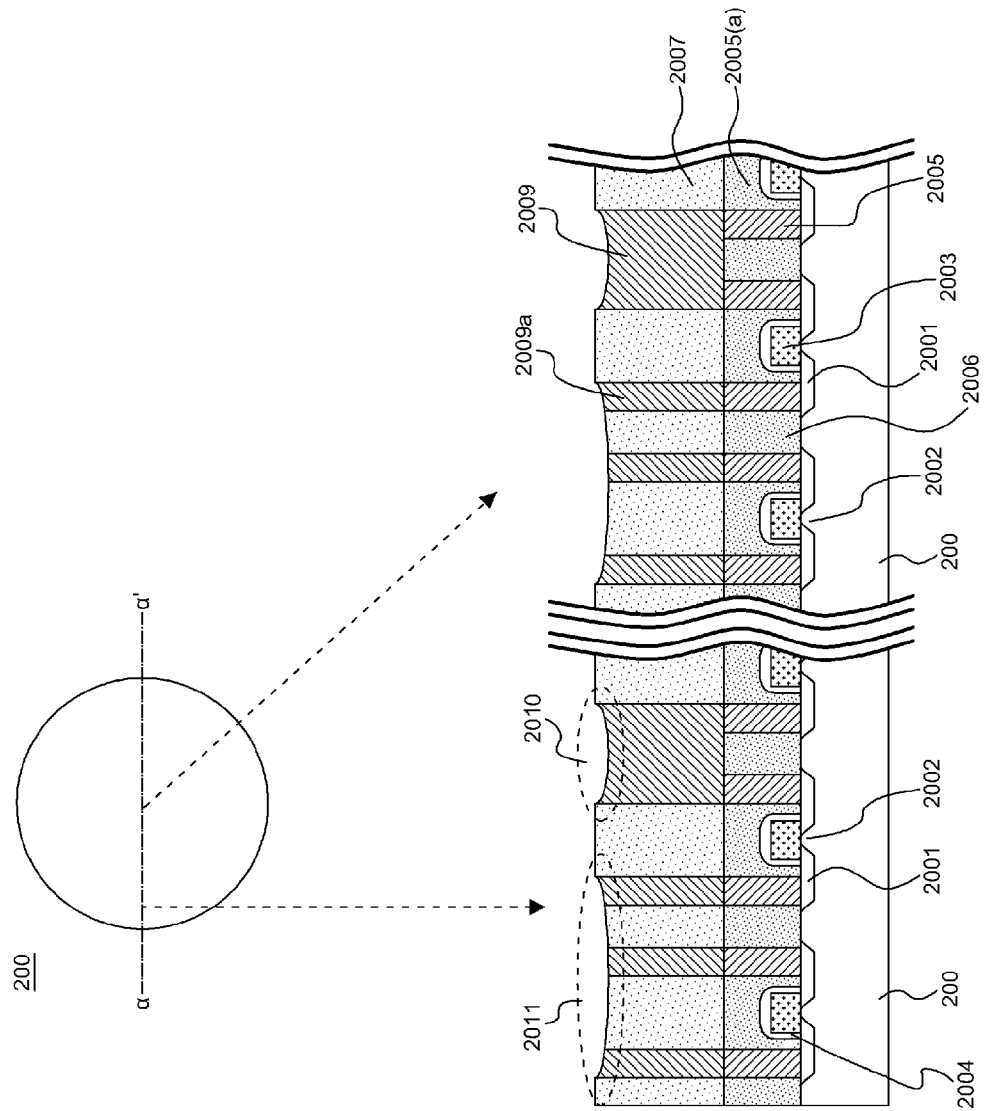
FIGS. 6A and 6B are views for describing the processing state of the wafer according to the embodiment of the present invention.

Next, a metal film polishing process (S104) will be described with reference to FIGS. 1, 6A and 6B. As illustrated in FIGS. 5A, 5B and 5C, when the metal film is formed through the sputtering process or the plating process, the metal film 2009b is also formed on the insulating film 2007. Since the metal film 2009b electrically connects the metal films 2009a, a polishing process is performed so as to remove the metal film 2009b in order to avoid the electrical connection. Also, the polishing process is referred to as a chemical mechanical polishing (CMP) process.

The wafer 200 unloaded from the metal film forming apparatus is loaded into a first polishing apparatus. In the present process, in order to more reliably insulate the metal films 2009a from each other, the metal film 2009b is over-polished. When the metal film 2009b is over-polished, the metal films 2009b are removed, and the metal films 2009a are insulated from each other as illustrated in FIGS. 6A and 6B. Also, due to a difference between polishing rates of the insulating film 2007 and the metal film 2009 or a density of the metal film 2009, a dishing 2010 or an erosion 2011 is formed on the insulating film 2007 and the metal film 2009.

After the wafer 200 is processed by the first polishing apparatus for a predetermined time, the wafer 200 is unloaded from the first polishing apparatus.

Here, a layer including the insulating film 2007 and the metal film 2009 after the polishing process is referred to as a first layer having a multilayer wiring. Also, the metal film 2009 is referred to as a first metal film, a first layer having a metal wiring or an M1 layer.

[Barrier Insulating Film Forming Process (S105)]

Figures 7A, 7B:
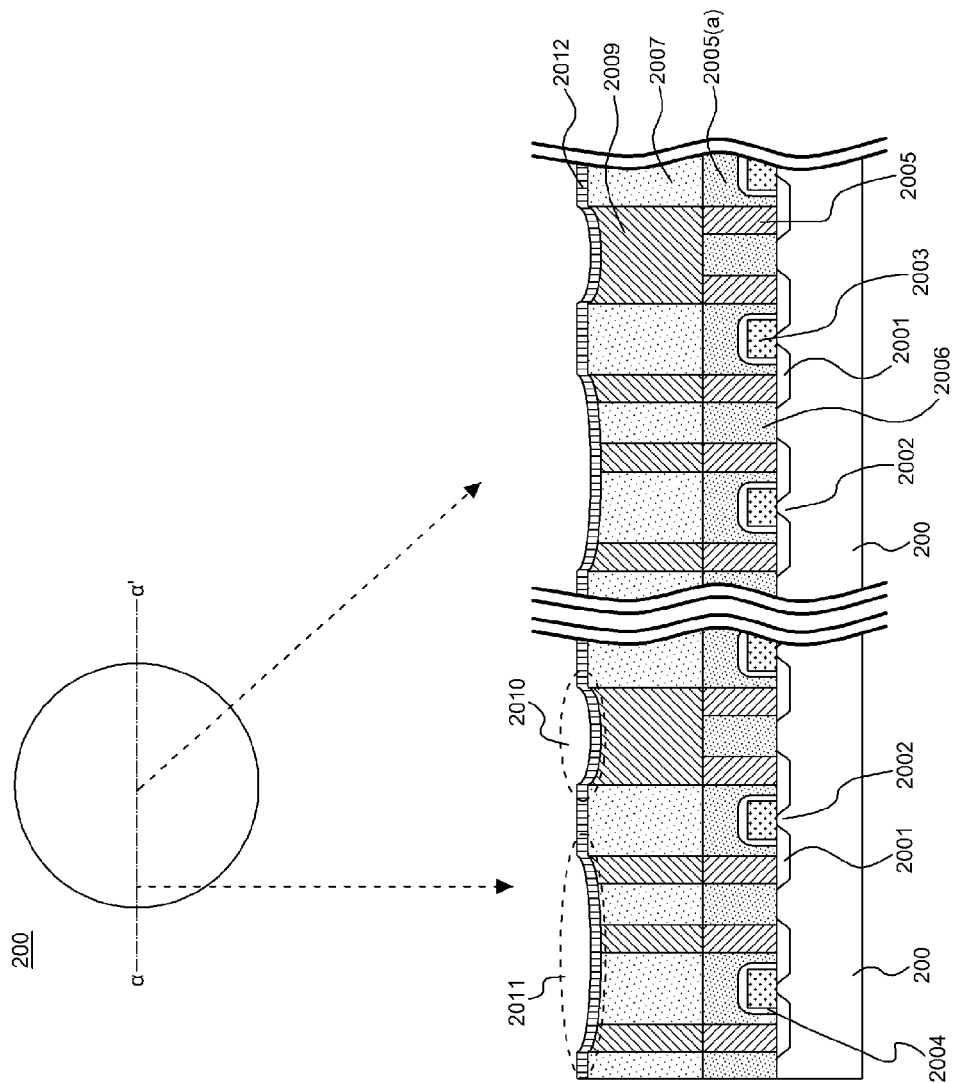
FIGS. 7A and 7B are views for describing the processing state of the wafer according to the embodiment of the present invention.

Next, a barrier insulating film forming process (S105) will be described with reference to FIGS. 1, 7A and 7B. The wafer 200 unloaded from the first polishing apparatus is loaded into a barrier insulating film forming apparatus. A barrier insulating film 2012 used as a barrier insulating film to prevent the diffusion of the metal film 2009 to be described later is formed by the barrier insulating film forming apparatus. The barrier insulating film 2012 may also be referred to as a second barrier film in order to be distinguished from the above-described barrier metal film.

The barrier insulating film 2012 which is a material that is difficult to etch in a patterning process to be described later includes, for example, any one of a silicon carbide (SiC) film, a silicon nitride (SiN) film and a silicon carbonitride (SiCN) film.

The barrier insulating film 2012 is formed on the insulating film 2007 and the metal film 2009. Therefore, the barrier insulating film 2012 is also formed on the dishing 2010 or the erosion 2011. Therefore, a barrier insulating film 2012 having a concave shape is formed on the dishing 2010 or the erosion 2011.

After the barrier insulating film 2012 is formed, the wafer 200 is unloaded from the barrier insulating film forming apparatus.

[Second Insulating Film Forming Process (S106)]

Figures 8A, 8B:
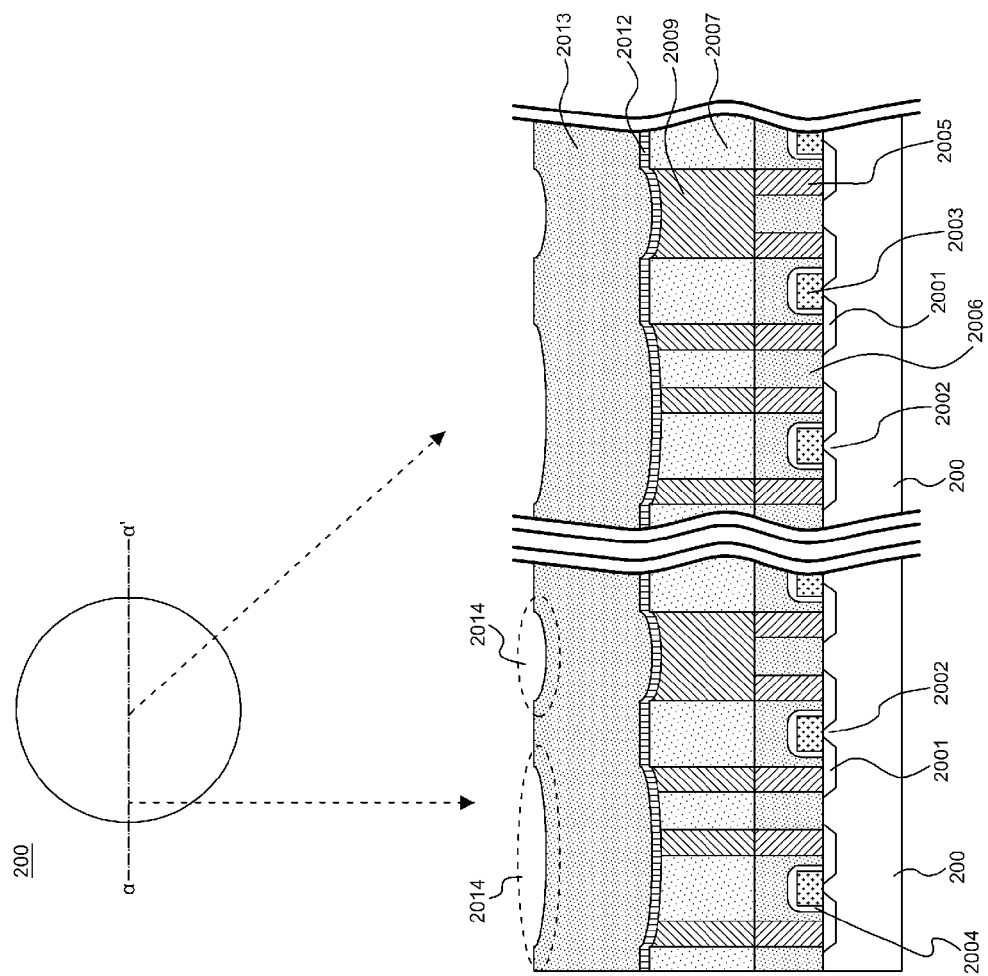
FIGS. 8A and 8B are views for describing the processing state of the wafer according to the embodiment of the present invention.

Next, a second insulating film forming process (S106) will be described with reference to FIGS. 1, 8A and 8B. When the wafer 200 is loaded into a substrate processing apparatus (a second insulating film forming apparatus) for forming a second insulating film, a silicon-containing gas and an oxygen-containing gas are supplied into a process chamber of the substrate processing apparatus. The supplied gases react with each other in the process chamber, and a second interlayer insulating film 2013 which insulates between metal films 2020 or between metal films 2019 to be described later other [also referred to simply as an insulating film 2013, a second insulating film 2013 or a wiring forming insulating film 2013] is formed. The insulating film 2013 includes, for example, a silicon oxide film (a $SiO_2$ film). The silicon-containing gas is, for example, a TEOS gas, and the oxygen-containing gas is, for example, an oxygen gas. The insulating film 2013 is not limited to the silicon oxide film but may also be a low dielectric constant film (a low-k film) or a silicon oxynitride film.

After a predetermined time has elapsed, when the insulating film 2013 is formed, the wafer 200 is unloaded from the substrate processing apparatus (the second insulating film forming apparatus).

The insulating film 2013 is formed on the barrier insulating film 2012. Therefore, due to the influence of the dishing 2010 or the erosion 2011, the insulating film 2013 including a concave portion 2014 is formed on the dishing 2010 or the erosion 2011. Since the concave portion 2014 affects the characteristic of the semiconductor device, the concave portion 2014 is planarized in the following second insulating film polishing process (S107).

[Second Insulating Film Polishing Process (S107)]

Next, the second insulating film polishing process (S107) will be described with reference to FIGS. 9 through 15. The wafer 200 unloaded from the second insulating film forming apparatus is loaded into a second polishing apparatus 400, and the insulating film 2013 is polished. The concave portion 2014 is removed by polishing the insulating film 2013.

Hereinafter, the polishing process will be described in detail. After the wafer 200 is unloaded from the second insulating film forming apparatus, the wafer 200 is loaded into the polishing apparatus 400 illustrated in FIG. 9.

Figure 9:
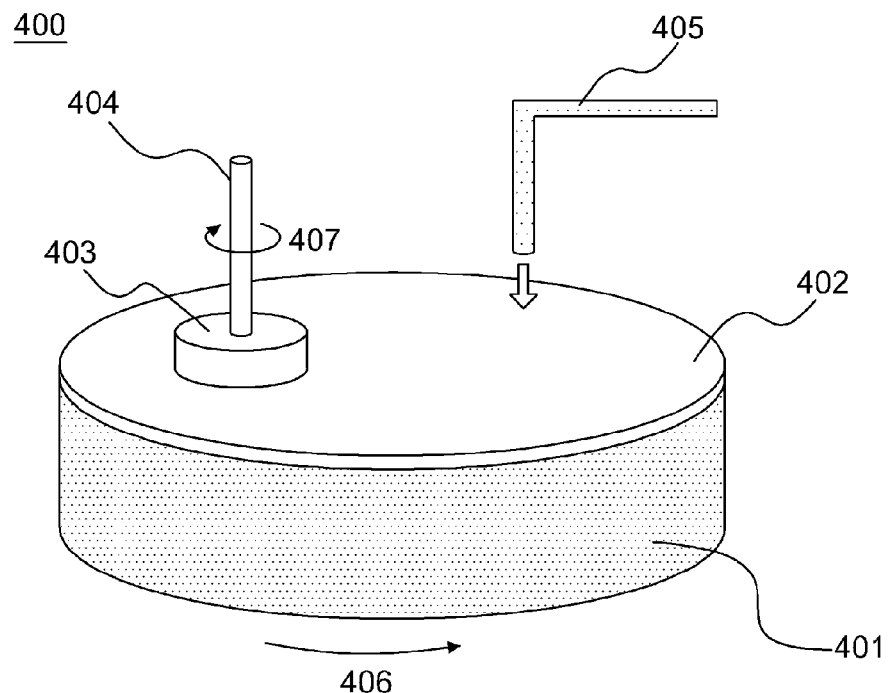
FIG. 9 is a view for describing a polishing apparatus according to the embodiment of the present invention.

In FIG. 9, reference numeral 401 refers to a polishing plate, and reference numeral 402 refers to a polishing cloth for polishing the wafer 200. The polishing plate 401 is connected to a rotating mechanism (not illustrated), and the polishing plate 401 rotates in a direction of an arrow 406 during polishing the wafer 200.

Reference numeral 403 refers to a polishing head, and a shaft 404 is connected to an upper surface of the polishing head 403. The shaft 404 is connected to the rotating mechanism and a vertical driving mechanism (not illustrated). While the wafer 200 is being polished, the shaft 404 rotates in a direction of an arrow 407.

Reference numeral 405 refers to a supply pipe for supplying slurry (an abrasive). While the wafer 200 is being polished, the slurry is supplied from a supply pipe 405 onto the polishing cloth 402.

Figure 10:
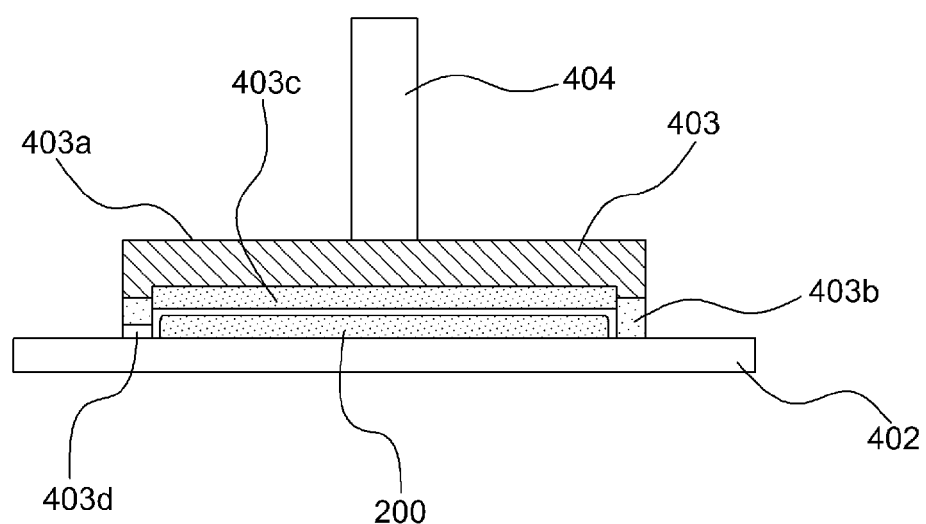
FIG. 10 is a view for describing the polishing apparatus according to the embodiment of the present invention.

Next, the polishing head 403 and peripheral structures thereof will be described in detail with reference to FIG. 10. FIG. 10 is a view for describing the peripheral structures around the cross-sectional view of the polishing head 403. The polishing head 403 includes a top ring 403a, a retainer ring 403b and an elastic mat 403c. While the wafer 200 is being polished, an outer portion of the wafer 200 is surrounded by the retainer ring 403b and is held down by the elastic mat 403c and the polishing cloth 402. A groove 403d for flowing the slurry from the outside of the retainer ring 403b to the inside is formed in the retainer ring 403b. A plurality of grooves 403d are installed in a cylindrical shape to match a shape of the retainer ring 403b. By the interposed grooves 403d, used slurry is replaced by unused fresh slurry.

Next, operations in the present process will be described. When the wafer 200 is loaded into the polishing head 403, the slurry is supplied through the supply pipe 405, and the polishing plate 401 and the polishing head 403 rotate. The slurry is introduced into the retainer ring 403b and polishes a surface of the wafer 200. The concave portion 2014 may be removed by polishing in this manner. After the polishing is performed for a predetermined time, the wafer 200 is unloaded from the polishing apparatus 400.

Figure 11:
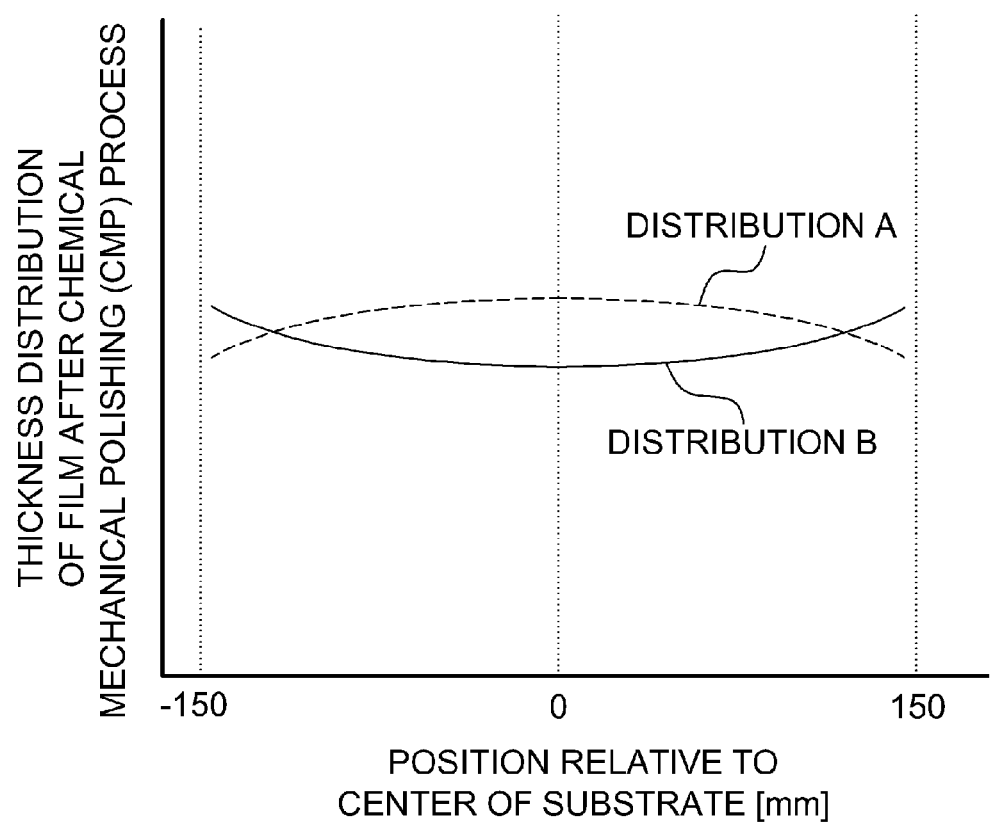
FIG. 11 is a graph for describing a thickness distribution of an insulating film after a polishing process according to the embodiment of the present invention.

Meanwhile, when the present process is performed, the inventors have found that a height of the insulating film 2013 on the wafer 200 may not be uniform as illustrated in FIG. 11. That is, a thickness of the insulating film 2013 may not be uniform. For example, it is seen that there is a distribution A in which a film thickness of the second insulating film at a peripheral portion of the wafer 200 is smaller than that of the second insulating film at a center portion thereof or a distribution B in which the film thickness of the film at the center portion of the wafer 200 is smaller than that of the film at the peripheral portion thereof When a thickness distribution of the insulating film 2013, that is, a height distribution of the film, is biased, a variation in heights of via-holes occurs in the patterning process to be described later. A variation in the characteristic of the metal film on the wafer 200 occurs due to the variation, and as a result, the yield is decreased.

According to the results of an intensive research by the inventors to deal with this problem, it is seen that there are causes for each of the distribution A and the distribution B. Hereinafter, the causes will be described.

The cause of the distribution A is a method of supplying the slurry to the wafer 200. As described above, the slurry supplied to the polishing cloth 402 is supplied from the vicinity of the wafer 200 through the interposed retainer ring 403b. Thus, slurry that has polished the peripheral portion of the wafer 200 is introduced to the center portion of the wafer 200, and unused fresh slurry is introduced to the peripheral portion of the wafer 200. Since the fresh slurry has a high polishing efficiency, the peripheral portion of the wafer 200 is further polished compared to the center portion. From the above, it is seen that the thickness distribution of the insulating film 2013 becomes that of the distribution A.

The cause of the distribution B is the wear of the retainer ring 403b. When a large number of the wafers 200 are polished in the polishing apparatus 400, a front end of the retainer ring 403b held down by the polishing cloth 402 becomes worn, and a surface in contact with the groove 403d or the polishing cloth 402 becomes deformed. Accordingly, there is a case in which the slurry that originally should be supplied is not supplied to an inner peripheral portion of the retainer ring 403b. In this case, since the slurry is not supplied to the peripheral portion of the wafer 200, the center portion of the wafer 200 is polished while the peripheral portion of the wafer 200 is not polished. Therefore, the inventors have found that the thickness distribution of the insulating film 2013 becomes that of the distribution B.

Thus, as described later, the present embodiment includes a compensating process in which the insulating film 2013 on the wafer 200 is polished by the polishing apparatus 400, and then a height of a stacked insulating film on the substrate is matched. The term "stacked insulating film" used herein refers to a layer in which an insulating film 2015 to be described later is stacked on the insulating film 2013. In other words, the stacked insulating film includes the insulating film 2013 as a part and the insulating film 2015 as another part.

As a specific method of matching the height of the stacked insulating film, after the second insulating film polishing process (S107), the thickness distribution of the insulating film 2013 is measured in a process of measuring a thickness of the second insulating film (S108), and a third insulating film forming process (S109) is performed according to the measured data. In such a configuration, heights of through-holes 2016 to be described later may be adjusted on the wafer 200.

[Process of Measuring the Thickness of the Film (S108)]

Next, the process of measuring the thickness of the film (S108) will be described. In the process of measuring the thickness of the film (S108), the thickness of the polished insulating film 2013 is measured using a measuring apparatus. Since a conventional apparatus can be used as the measuring apparatus, a detailed description is omitted. The term "thickness" used herein refers to, for example, a thickness from the surface of the wafer 200 to a surface of the insulating film 2013.

After the polishing process (S107), the wafer 200 is loaded into the measuring apparatus. The measuring apparatus measures the thickness (height) of distribution of the insulating film 2013 by measuring at least several portions in the center portion of the wafer 200 and the peripheral portion in the periphery of the center portion which are easily affected by the polishing apparatus 400. The measured data are transmitted to a substrate processing apparatus 900 to be described later through a host apparatus 270. After the measuring process, the wafer 200 is unloaded from the measuring apparatus.

[Third Insulating Film Forming Process (S109)]

Next, a third insulating film forming process (S109) will be described. The third insulating film 2015 [referred to as an insulating film 2015 or a third interlayer insulating film] has the same configuration as the second insulating film 2013. In the present process, as illustrated in FIGS. 12A and 12B or 14A and 14B, the third interlayer insulating film 2015 is formed on the polished second insulating film 2013. Here, a layer in which the second insulating film 2013 and the third insulating film 2015 are stacked is referred to as a stacked insulating film. Also, the third insulating film is a layer for compensating for the thickness distribution of the stacked insulating film and thus may be referred to as a compensation film. Also, the third insulating film forming process (S109) is a process in which the third insulating film for compensating for the thickness distribution of the stacked insulating film is formed and thus may be referred to as a compensation process.

The third interlayer insulating film 2015 is formed to compensate for the thickness distribution of the polished second interlayer insulating film 2013 through the third insulating film forming process (S109). More preferably, the third interlayer insulating film 2015 is formed to adjust a height of a surface of the third interlayer insulating film 2015 to be uniform. The term "height" used herein refers to the height of the surface of the third interlayer insulating film 2015, and in other words, refers to a distance from the surface of the wafer 200 to the surface of the third interlayer insulating film 2015.

Figures 12A, 12B:
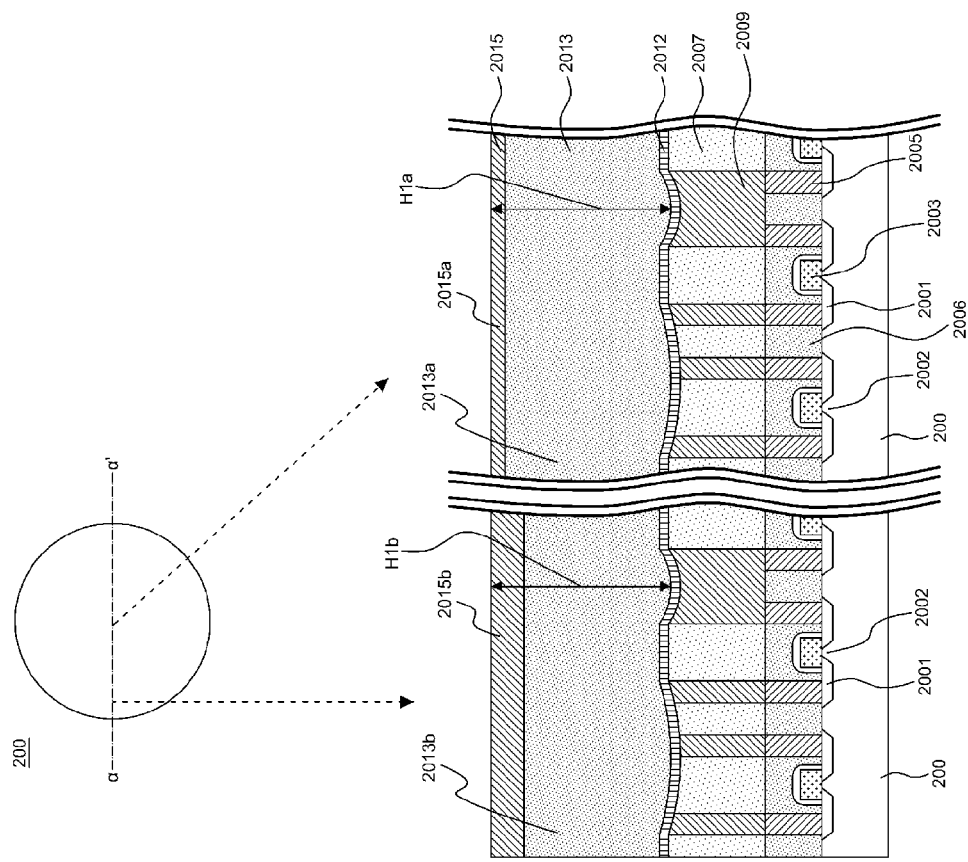
FIGS. 12A and 12B are views for describing the processing state of the wafer according to the embodiment of the present invention.
Figure 13:
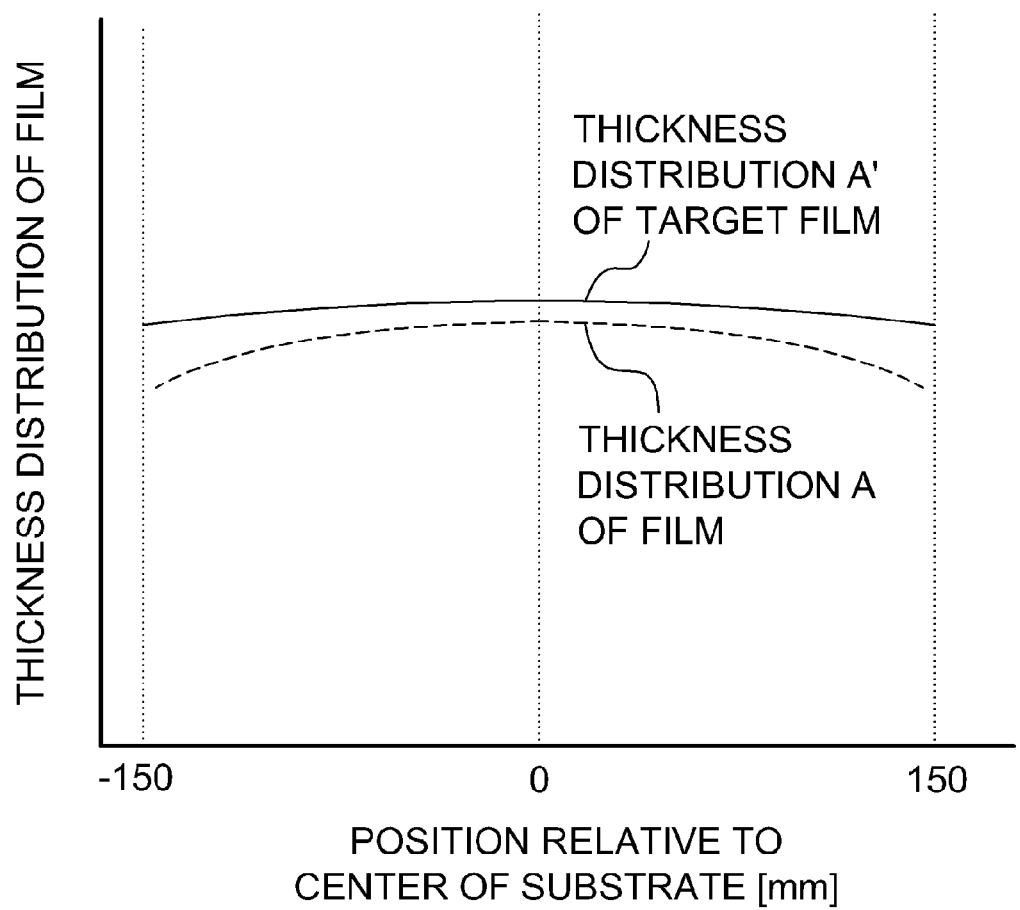
FIG. 13 is a graph for describing the thickness distribution of the insulating film according to the embodiment of the present invention.
Figures 14A, 14B:
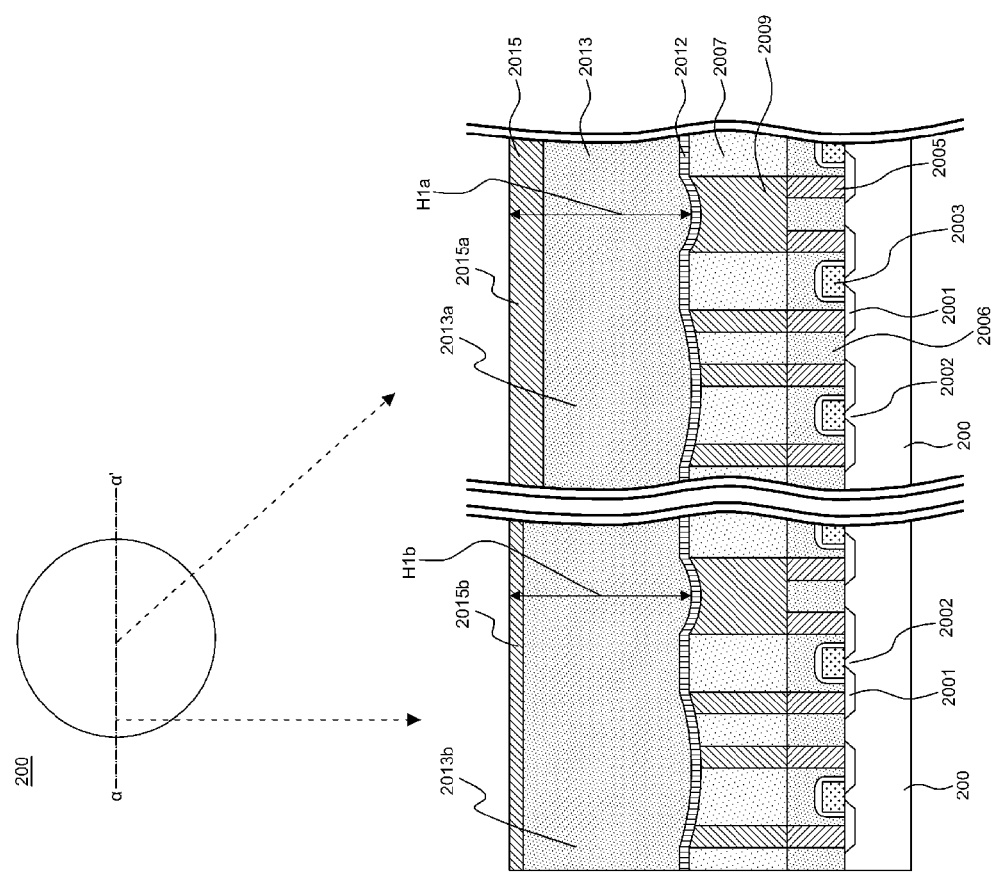
FIGS. 14A and 14B are views for describing the processing state of the wafer according to the embodiment of the present invention.
Figure 15:
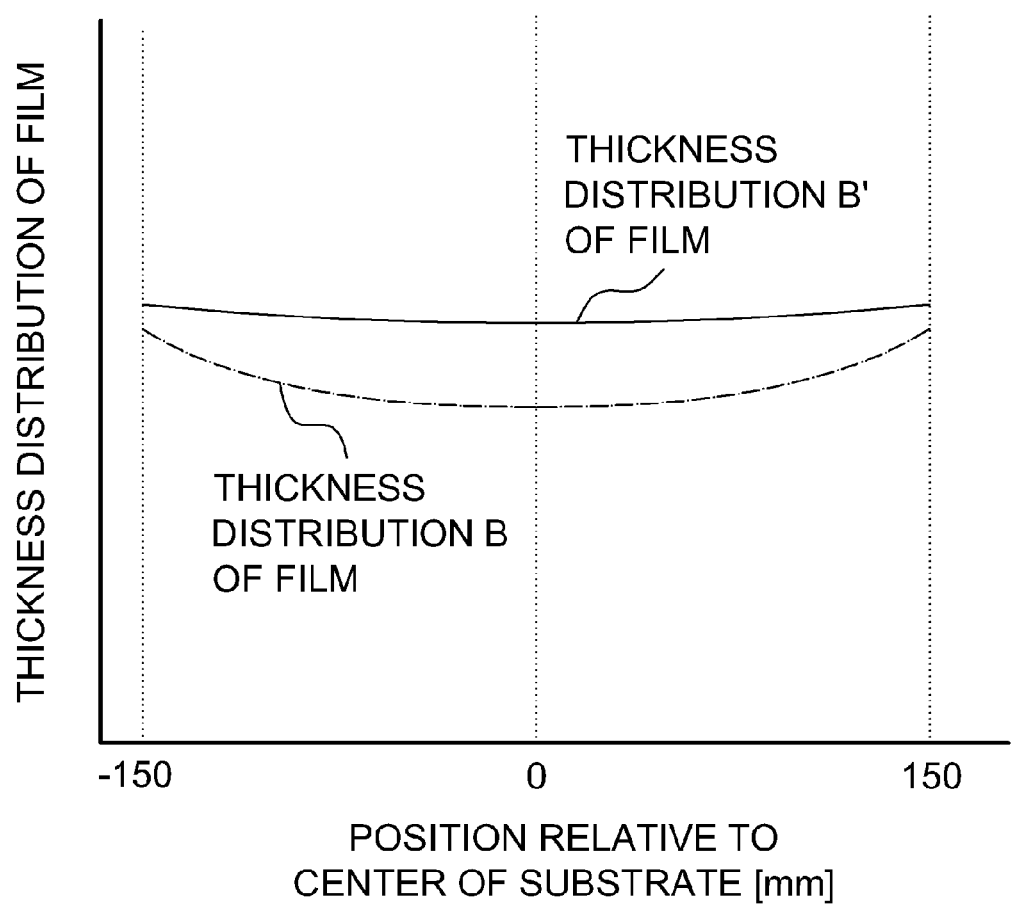
FIG. 15 is a graph for describing the thickness distribution of the insulating film according to the embodiment of the present invention.

Hereinafter, the present process will be described with reference to FIGS. 12A through 20. FIGS. 12A and 12B are views for describing the third insulating film 2015 formed in the present process when the thickness of the second insulating film 2013 has the distribution A. FIG. 13 is a graph for describing a thickness distribution A and a compensation distribution A'. FIGS. 14A and 14B are views for describing the third insulating film 2015 formed in the present process when the thickness of the second insulating film 2013 has the distribution B. FIG. 15 is a graph for describing a thickness distribution B and a compensation distribution B'. FIGS. 16 through 20 are views for describing the substrate processing apparatus for implementing the present process.

FIG. 12A is a top view illustrating the wafer 200 after forming the third insulating film 2015. FIG. 12B is a view illustrating the center portion of the wafer 200 and the peripheral portion thereof in a cross-sectional view taken along line a-a' of FIG. 12A in the thickness distribution A.

FIG. 14A is a top view illustrating the wafer 200 after forming the third insulating film 2015. FIG. 14B is a view illustrating the center portion of the wafer 200 and the peripheral portion thereof in a cross-sectional view taken along line a-a' of FIG. 14A in the thickness distribution B.

Here, the second insulating film 2013 of the center portion of the wafer 200 is referred to as an insulating film 2013a, the third insulating film 2015 thereof is referred to as an insulating film 2015a, the second insulating film 2013 of the peripheral portion of the wafer 200 is referred to as an insulating film 2013b, and the third insulating film 2015 thereof is referred to as an insulating film 2015b.

Figure 16:
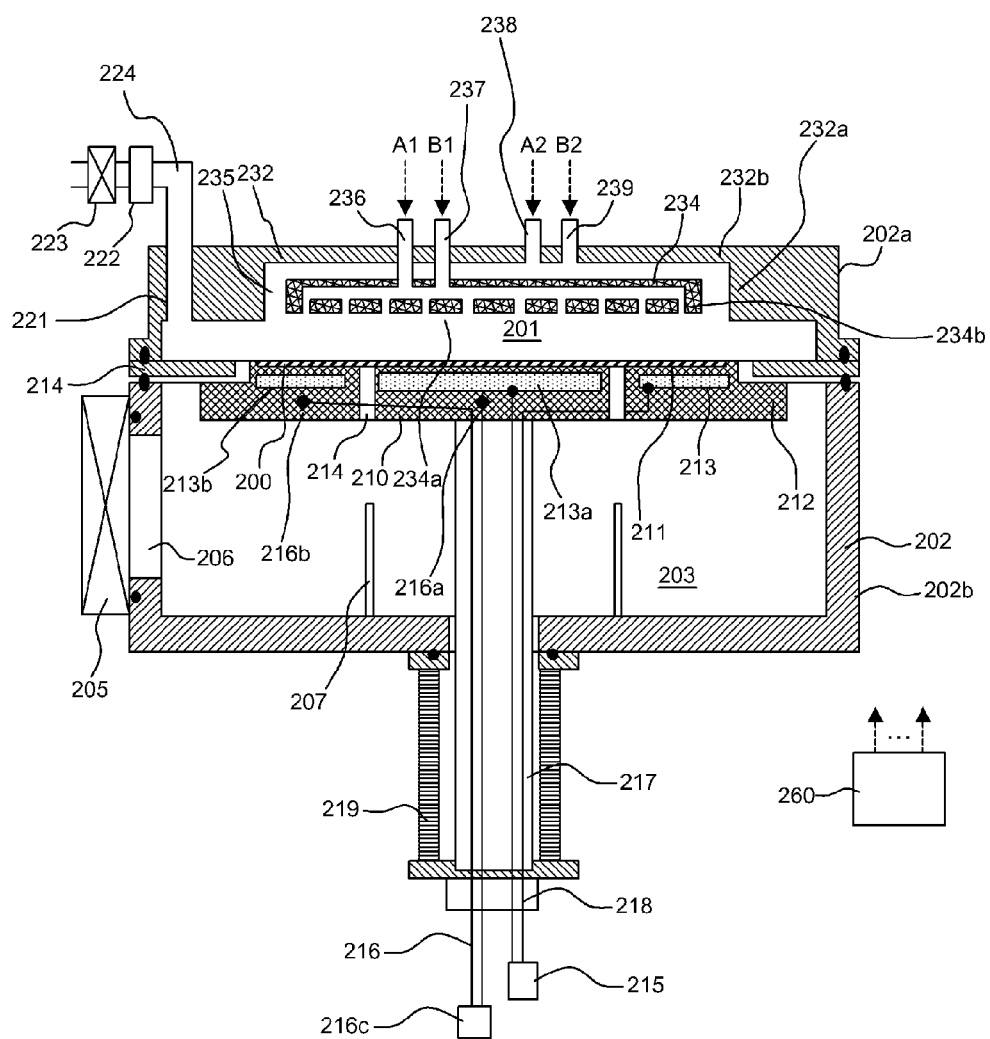
FIG. 16 is a view for describing a substrate processing apparatus according to the embodiment of the present invention.

The wafer 200 unloaded from the measuring apparatus is loaded into the substrate processing apparatus 900 illustrated in FIG. 16, which is an apparatus for forming the third insulating film 2015.

The substrate processing apparatus 900 controls the thickness of the third insulating film 2015 on the substrate based on the data measured in the process of measuring the thickness of the second insulating film (S108). For example, when the data received from the host apparatus 270 are data which indicate the distribution A, the substrate processing apparatus 900 controls the thickness of the third insulating film 2015, so that a thickness of the insulating film 2015b at the peripheral portion of the wafer 200 is made large and a thickness of the insulating film 2015a at the center portion of the wafer 200 is made smaller than that of the insulating film 2015b at the peripheral portion. Also, when the data received from the host apparatus 270 are data which indicate the distribution B, the substrate processing apparatus 900 controls the thickness of the third insulating film 2015, so that the thickness of the insulating film 2015a at the center portion of the wafer 200 is made large and the thickness of the insulating film 2015b at the peripheral portion of the wafer 200 is made smaller than that of the insulating film 2015a.

More preferably, the substrate processing apparatus 900 controls the thickness of the third insulating film 2015, so that the height of the stacked insulating film in which the second insulating film 2013 and the third insulating film 2015 are stacked is within a predetermined range on the wafer 200. In other words, the substrate processing apparatus 900 controls the thickness distribution of the third interlayer insulating film 2015 to adjust the height, so that the distribution the height of the stacked insulating film in which the second insulating film 2013 and the third insulating film 2015 are stacked is within a predetermined range on the substrate.

That is, as illustrated in FIGS. 12A, 12B, 14A and 14B, a height H1a from a surface of the barrier insulating film 2012 of the center portion of the wafer 200 to an upper end of the third insulating film 2015a and a height H1b from a surface of the barrier insulating film 2012 of the peripheral portion of the wafer 200 to an upper end of the third insulating film 2015b may be matched.

Next, the substrate processing apparatus 900 capable of controlling the thickness of each of the insulating film 2015a and the insulating film 2015b will be described in detail.

The substrate processing apparatus 900 according to the present embodiment will be described. The substrate processing apparatus 900 is, for example, a single substrate processing apparatus as illustrated in FIG. 16.

As illustrated in FIG. 16, the substrate processing apparatus 900 includes a process container 202. The process container 202 is, for example, an airtight container having a circular and flat cross section. Also, the process container 202 is formed of, for example, a metallic material such as aluminum (Al), stainless steel (SUS) or the like or quartz. A process space (process chamber) 201 which processes a silicon wafer or the like serving as a substrate and a transfer space 203 are formed in the process container 202. The process container 202 includes an upper container 202a and a lower container 202b. A partition plate 204 is installed between the upper container 202a and the lower container 202b. A space above the partition plate 204, which is surrounded by the upper container 202a, is referred to as the process space 201 (referred to as a process chamber), and a space under the partition plate 204, which is surrounded by the lower container 202b, is referred to as a transfer space 203.

A substrate loading and unloading port 206 is installed adjacent to a gate valve 205 on a side surface of the lower container 202b, and the wafer 200 moves to a transfer chamber (not illustrated) through the substrate loading and unloading port 206. A plurality of lift pins 207 are installed at a bottom portion of the lower container 202b.

A substrate support 210 which supports the wafer 200 is installed in the process chamber 201. The substrate support 210 includes a placement surface 211 on which the wafer 200 is placed and a substrate placement unit 212 on whose surface is the placement surface 211. Preferably, a heater 213 serving as a heating unit is installed therein. When the heating unit is installed, the wafer 200 is heated, and the quality of a film formed on the wafer 200 can be improved. Through-holes 214 through which the lift pins 207 pass may be installed in the substrate placement unit 212 at positions corresponding to each of the lift pins 207.

The substrate placement unit 212 is supported by a shaft 217. The shaft 217 passes through a bottom portion of the process container 202 and is connected to a lifting mechanism 218 outside the process container 202. When the shaft 217 and the substrate placement unit 212 are lifted by operating the lifting mechanism 218, the wafer 200 placed on the substrate placement surface 211 may be lifted. Also, a vicinity of a lower end of the shaft 217 is covered with a bellows 219, and thus the inside of the process chamber 201 is air-tightly maintained.

When the wafer 200 is transferred, the substrate placement unit 212 is lowered, so that the placement surface 211 is at a position of the substrate loading and unloading port 206 (wafer transfer position) and, when the wafer 200 is processed, wafer 200 is lifted to a processing position (wafer processing position) in the process chamber 201 as illustrated in FIG. 16.

Specifically, when the substrate placement unit 212 is lowered to the wafer transfer position, upper ends of the lift pins 207 protrude from an upper surface of the substrate placement surface 211, and the lift pins 207 support the wafer 200 from below. Also, when the substrate placement unit 212 is lifted to the wafer processing position, the lift pins 207 are buried under the upper surface of the substrate placement surface 211, and the substrate placement surface 211 support the wafer 200 from below. Also, since the lift pins 207 are directly in contact with the wafer 200, the lift pins 207 are preferably formed of material such as quartz, alumina or the like. Also, the lift pins 207 are installed in the lifting mechanism 218, so that the substrate placement unit 212 and the lift pins 207 may operate relative to each other.

The heater 213 is configured to be capable of individually controlling heating of the center portion which is the center of the wafer 200 and the peripheral portion in the periphery of the center portion. The heater 213 includes, for example, a center-zone heater 213a and an outer-zone heater 213b. The center-zone heater 213a is installed at the center of the substrate placement surface 211 and a cylindrical shape in a plan view. The outer-zone heater 213b also has a cylindrical shape in a plan view and is installed at the periphery of the center-zone heater 213a. The center-zone heater 213a heats the center portion of the wafer 200, and the outer-zone heater 213b heats the peripheral portion of the wafer 200.

The center-zone heater 213a and the outer-zone heater 213b are respectively connected to a heater temperature control unit 215 through heater power supply lines. A heater temperature control mechanism 218 controls temperatures of the center portion and the peripheral portion of the wafer 200 by controlling the supply of power to each heater.

A temperature measuring apparatus 216a and a temperature measuring apparatus 216b, which measure the temperature of the wafer 200, are included in the substrate placement unit 212. The temperature measuring apparatus 216a is installed at a center portion of the substrate placement unit 212 to measure a temperature in the vicinity of the center-zone heater 213a. The temperature measuring apparatus 216b is installed at a peripheral portion of the substrate placement unit 212 to measure a temperature in the vicinity of the outer-zone heater 213b. The temperature measuring apparatus 216a and the temperature measuring apparatus 216b are connected to a temperature information receiving unit 216c. The temperatures measured by the temperature measuring apparatuses are transmitted to the temperature information receiving unit 216c. The temperature information receiving unit 216c transmits the received temperature information to a controller 260 to be described later. The controller 260 controls the temperature of a heater based on the received temperature information or the thickness information received from the host apparatus 270. Also, the temperature measuring apparatus 216a, the temperature measuring apparatus 216b and the temperature information receiving unit 216c are collectively referred to as a temperature detecting unit 216.

(Exhaust System)

An exhaust port 221 that exhausts an atmosphere in the process chamber 201 is installed at an inner wall of the process chamber 201 [the upper container 202a]. An exhaust pipe 224 serving as a first exhaust pipe is connected to the exhaust port 221, and a pressure regulator 222 including an auto pressure controller (APC), etc. which controls a pressure in the process chamber 201 to a predetermined pressure and a vacuum pump 223 are sequentially connected to the exhaust pipe 224. The first exhaust unit (exhaust line) mainly includes the exhaust port 221, the exhaust pipe 224 and the pressure regulator 222. Also, the vacuum pump 223 may be included in the first exhaust unit.

(Buffer Chamber)

A buffer chamber 232 is installed above the process chamber 201. The buffer chamber 232 includes side walls 232a and a ceiling 232b. A shower head 234 is embedded in the buffer chamber 232. A gas supply path 235 is disposed between the side walls 232a of the buffer chamber 232 and the shower head 234. That is, the gas supply path 235 is installed to surround side walls of 234b of the shower head 234.

Figure 17:
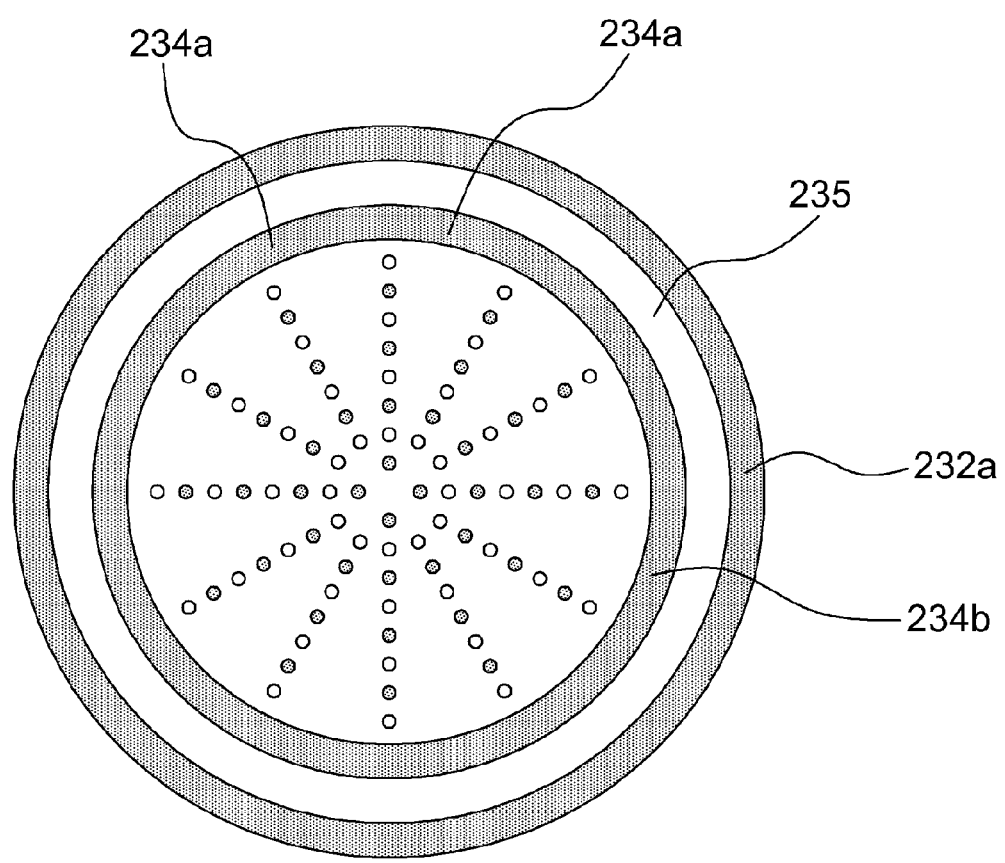
FIG. 17 is a view for describing a shower head of the substrate processing apparatus according to the embodiment of the present invention.

A distribution plate 234a is installed at a wall which divides the shower head 234 and the process chamber 201. The distribution plate 234a, for example, has a disk shape. Viewed from the processing chamber 201 side, as illustrated in FIG. 17, the gas supply path 235 is a structure installed between the side wall 234b and the side wall 232a and in the vicinity of the distribution plate 234a in a horizontal direction.

A gas inlet pipe 236 and a gas inlet pipe 237 pass through the ceiling 232b of the buffer chamber 232. Also, a gas inlet pipe 238 and a gas inlet pipe 239 are connected to the ceiling 232b of the buffer chamber 232. The gas inlet pipe 236 and the gas inlet pipe 237 are connected to the shower head 234. The gas inlet pipe 236 and the gas inlet pipe 238 are connected to a first gas supply system to be described later. The gas inlet pipe 237 and the gas inlet pipe 239 are connected to a second gas supply system to be described later.

A gas introduced through the gas inlet pipe 236 and the gas inlet pipe 237 is supplied into the process chamber 201 through the shower head 234. A gas introduced through the gas inlet pipe 238 and the gas inlet pipe 239 is supplied into the process chamber 201 through the gas supply path 235.

The gas supplied through the shower head 234 is supplied to the center of the wafer 200. The gas supplied through the gas supply path 235 is supplied into the edge of the wafer 200. The peripheral portion (edge) of the wafer refers to the periphery with respect to the center of the wafer. The shower head 234 is formed of, for example, a material such as quartz, alumina, stainless steel, aluminum or the like.

According to such a configuration, the shower head 234 is installed at a position facing the center portion of the wafer 200 placed on the substrate placement surface 211. Therefore, the gas supplied through the shower head 234 may be supplied to the center portion of the wafer 200. Also, the gas supply path 235 is installed at a position facing the peripheral portion of the wafer 200. Therefore, the supplied gas may be supplied to the peripheral portion of the wafer 200.

(Gas Supply System)

First Gas Supply System

Figure 18:
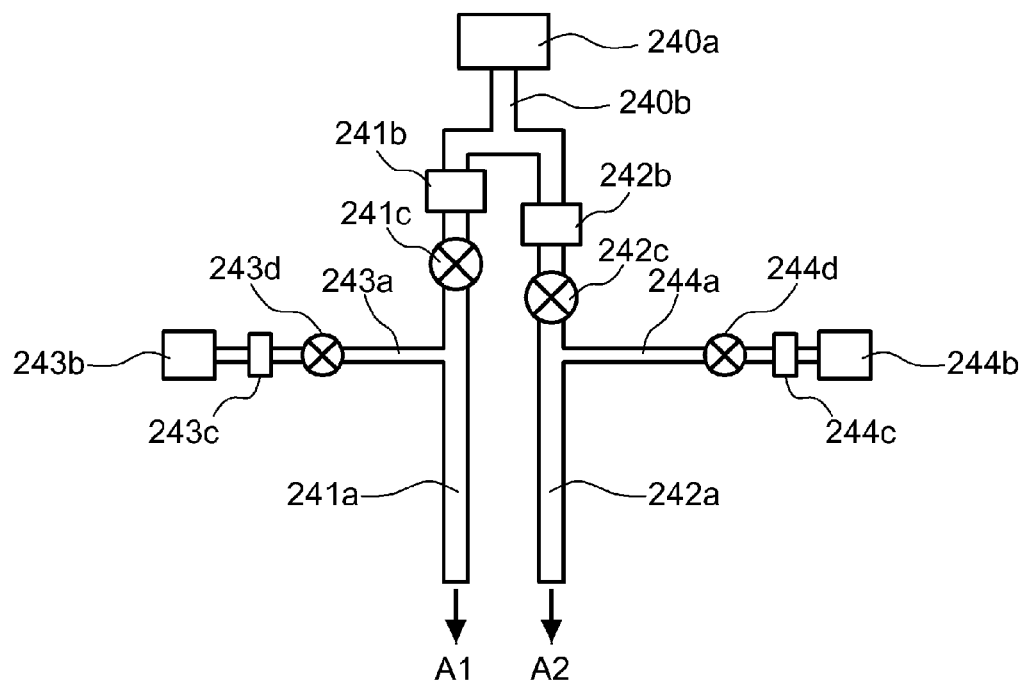
FIG. 18 is a view for describing a gas supply system of the substrate processing apparatus according to the embodiment of the present invention.

Next, the first gas supply system will be described with reference to FIG. 18. A1 of FIG. 18 is connected to A1 of FIG. 16, and A2 is connected to A2 of FIG. 16. That is, a gas supply pipe 241a is connected to the gas inlet pipe 236, and a gas supply pipe 242a is connected to the gas inlet pipe 238.

In the gas supply pipe 241a, a junction pipe 240b, a mass flow controller 241b and a valve 241c are installed sequentially from an upstream end. The mass flow controller 241b and the valve 241c control a flow rate of a gas passing through the gas supply pipe 241a. A first process gas source 240a is installed at an upstream side of the junction pipe 240b. A first process gas is a silicon-containing gas. For example, disilane ($Si_2H_6$) gas is used.

Preferably, a first inert gas supply pipe 243a for supplying an inert gas is connected to a downstream side of the valve 241c. In the first inert gas supply pipe 243a, an inert gas supply source 243b, a mass flow controller 243c, a valve 243d are installed sequentially from an upstream end. For example, helium (He) gas is used as the inert gas. The inert gas is added to the gas flowing through the gas supply pipe 241a and is used as a diluting gas. The substrate processing apparatus 900 may more optimally tune a concentration or a flow rate of the process gas supplied through the gas inlet pipe 236 and the shower head 234 by controlling the mass flow controller 243c and the valve 243d.

In the gas supply pipe 242a connected to the gas inlet pipe 238, a junction pipe 240b, a mass flow controller 242b and a valve 242c are installed sequentially from an upstream end. The mass flow controller 242b and the valve 242c control a flow rate of a gas passing through the gas supply pipe 242a. The first process gas source 240a is installed at the upstream side of the junction pipe 240b.

Preferably, a second inert gas supply pipe 244a for supplying an inert gas is connected to a downstream side of the valve 242c. In the second inert gas supply pipe 244a, an inert gas supply source 244b, a mass flow controller 244c and a valve 244d are installed from sequentially an upstream end. For example, helium (He) gas is used as the inert gas. The inert gas is added to the gas flowing through the gas supply pipe 242a and is used as a diluting gas. The substrate processing apparatus 900 may more optimally tune a concentration or a flow rate of the gas flowing through the gas inlet pipe 238 and the gas supply path 235 by controlling the mass flow controller 244c and the valve 244d.

The gas supply pipe 241a, the mass flow controller 241b, the valve 241c, the gas supply pipe 242a, the mass flow controller 242b, the valve 242c and the junction pipe 240b are referred to as the first gas supply system. Also, the first process gas source 240a, the gas inlet pipe 236 and the gas inlet pipe 238 may be included in the first gas supply system.

The first inert gas supply pipe 243a, the mass flow controller 243c, the valve 243d, the second inert gas supply pipe 244a, the mass flow controller 244c and the valve 244d are referred to as a first inert gas supply system. Also, the inert gas supply source 243b and the inert gas supply source 244b may be included in the first inert gas supply system. Also, the first gas supply system may include the first inert gas supply system.

Also, in the present embodiment, the gas supply pipe 241a is referred to as a first gas supply pipe, and the gas supply pipe 242a is referred to as a second gas supply pipe.

Also, only the mass flow controller 241b or a combination of the mass flow controller 241b and the valve 241c is referred to as a first process gas flow rate control unit. Also, only the mass flow controller 242b or a combination of the mass flow controller 242b and the valve 242c is referred to as a second process gas flow rate control unit.

Also, only the mass flow controller 243c or a combination of the mass flow controller 243c and the valve 243d is referred to as a first inert gas flow rate control unit. Also, only the mass flow controller 244c or a combination of the mass flow controller 244c and the valve 244d is referred to as a second inert gas flow rate control unit.

(Second Gas Supply System)

Figure 19:
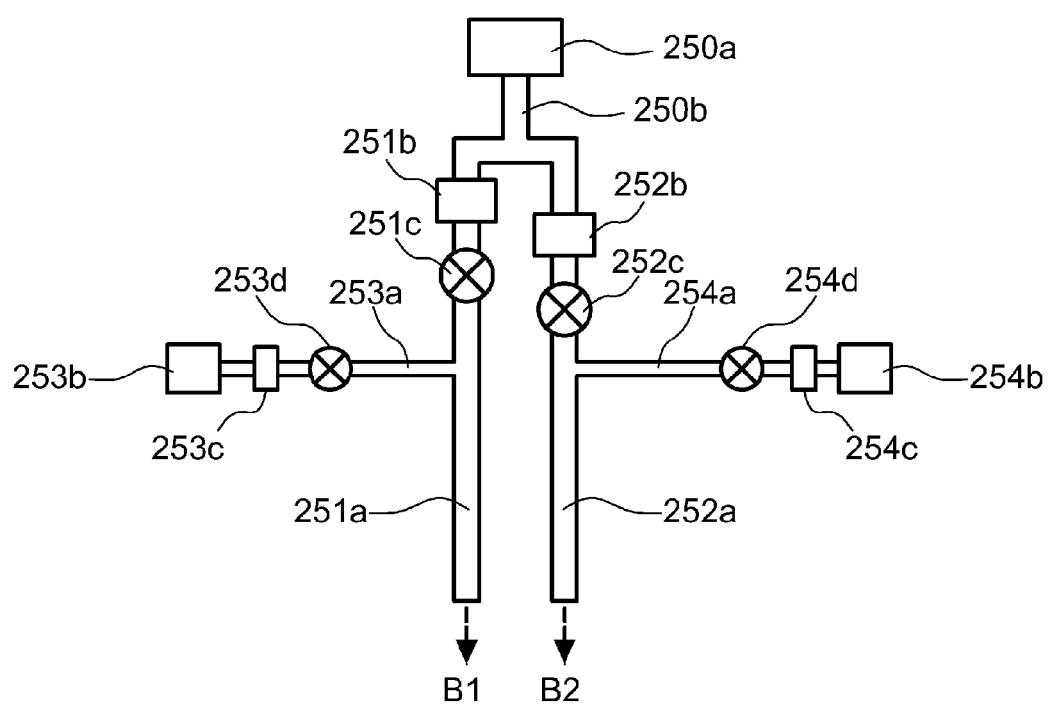
FIG. 19 is a view for describing the gas supply system of the substrate processing apparatus according to the embodiment of the present invention.

Next, the second gas supply system will be described with reference to FIG. 19. B1 of FIG. 19 is connected to B1 of FIG. 16, and B2 is connected to B2 of FIG. 16. That is, a gas supply pipe 251a is connected to the gas inlet pipe 237, and a gas supply pipe 252a is connected to the gas inlet pipe 239.

In the gas supply pipe 251a, a junction pipe 250b, a mass flow controller 251b and a valve 251c are installed sequentially from an upstream end. The mass flow controller 251b and the valve 251c control a flow rate of a gas passing through the gas supply pipe 251a. A second process gas source 250a is installed at an upstream side of the junction pipe 250b. A second process gas is an oxygen-containing gas. For example, oxygen gas ($O_2$) is used.

Preferably, a third inert gas supply pipe 253a for supplying an inert gas is installed in a downstream side of the valve 251c. In the third inert gas supply pipe 253a, an inert gas source 253b, a mass flow controller 253c and a valve 253d are installed sequentially from an upstream end. For example, helium (He) gas is used as the inert gas. The inert gas is used as a diluting gas for the gas flowing through the gas supply pipe 251a. The substrate processing apparatus 900 may more optimally tune a concentration or a flow rate of the gas supplied through the gas inlet pipe 237 and the shower head 234 by controlling the mass flow controller 253c and the valve 253d.

In the gas supply pipe 252a, a junction pipe 250b, a mass flow controller 252b and the valve 252c are installed from an upstream end. The mass flow controller 252b and the valve 252c control a flow rate of a gas passing through the gas supply pipe 252a. A second process gas source 250a is installed at an upstream side of the junction pipe 250b.

Preferably, a fourth inert gas supply pipe 254a for supplying an inert gas is installed at a downstream side of the valve 252c. In the fourth inert gas supply pipe 254a, an inert gas source 254b, a mass flow controller 254c and a valve 254d are installed from an upstream end. For example, helium (He) gas is used as the inert gas. The inert gas is used as a diluting gas for the gas flowing through the gas supply pipe 252a. The substrate processing apparatus 900 may more optimally tune a concentration or a flow rate of the gas flowing through the gas inlet pipe 239 and the gas supply path 235 by controlling the mass flow controller 254c and the valve 254d.

The gas supply pipe 251a, the mass flow controller 251b, the valve 251c, the gas supply pipe 252a, the mass flow controller 252b, the valve 252c and the junction pipe 250b are referred to as the second gas supply system. Also, the gas source 250a, the gas inlet pipe 237 and the gas inlet pipe 239 may be included in the second gas supply system.

The third inert gas supply pipe 253a, the mass flow controller 253c, the valve 253d, the fourth inert gas supply pipe 254a, the mass flow controller 254c, and the valve 254d are referred to as a second inert gas supply system. Also, the inert gas source 253b and the inert gas source 254b may be included in a second inert gas supply system. Also, the second gas supply system may include the second inert gas supply system. Also, the first gas supply system and the second gas supply system are referred to as a gas supply system.

Also, in the present embodiment, the gas supply pipe 251a is referred to as a third gas supply pipe, and the gas supply pipe 252a is referred to as a fourth gas supply pipe.

Also, only the mass flow controller 251b or a combination of the mass flow controller 251b and the valve 251c is referred to as a third process gas flow rate control unit. Also, only the mass flow controller 252b or a combination of the mass flow controller 252b and the valve 242c is referred to as a fourth process gas flow rate control unit.

Also, only the mass flow controller 253c or a combination of the mass flow controller 253c and the valve 253d is referred to as a first inert gas flow rate control unit. Also, only the mass flow controller 254c or a combination of the mass flow controller 254c and the valve 254d is referred to as a second inert gas flow rate control unit.

As described above, since the mass flow controller and the valve are installed in each of the first gas supply system and the second gas supply system, the amounts of the gases may by individually controlled. Also, since the mass flow controller and the valve are installed in each of the first inert gas supply system and the second inert gas supply system, the concentrations of the gases may by individually controlled.

(Control Unit)

The substrate processing apparatus 900 includes the controller 260 which controls operations of respective units of the substrate processing apparatus 900.

Figure 20:
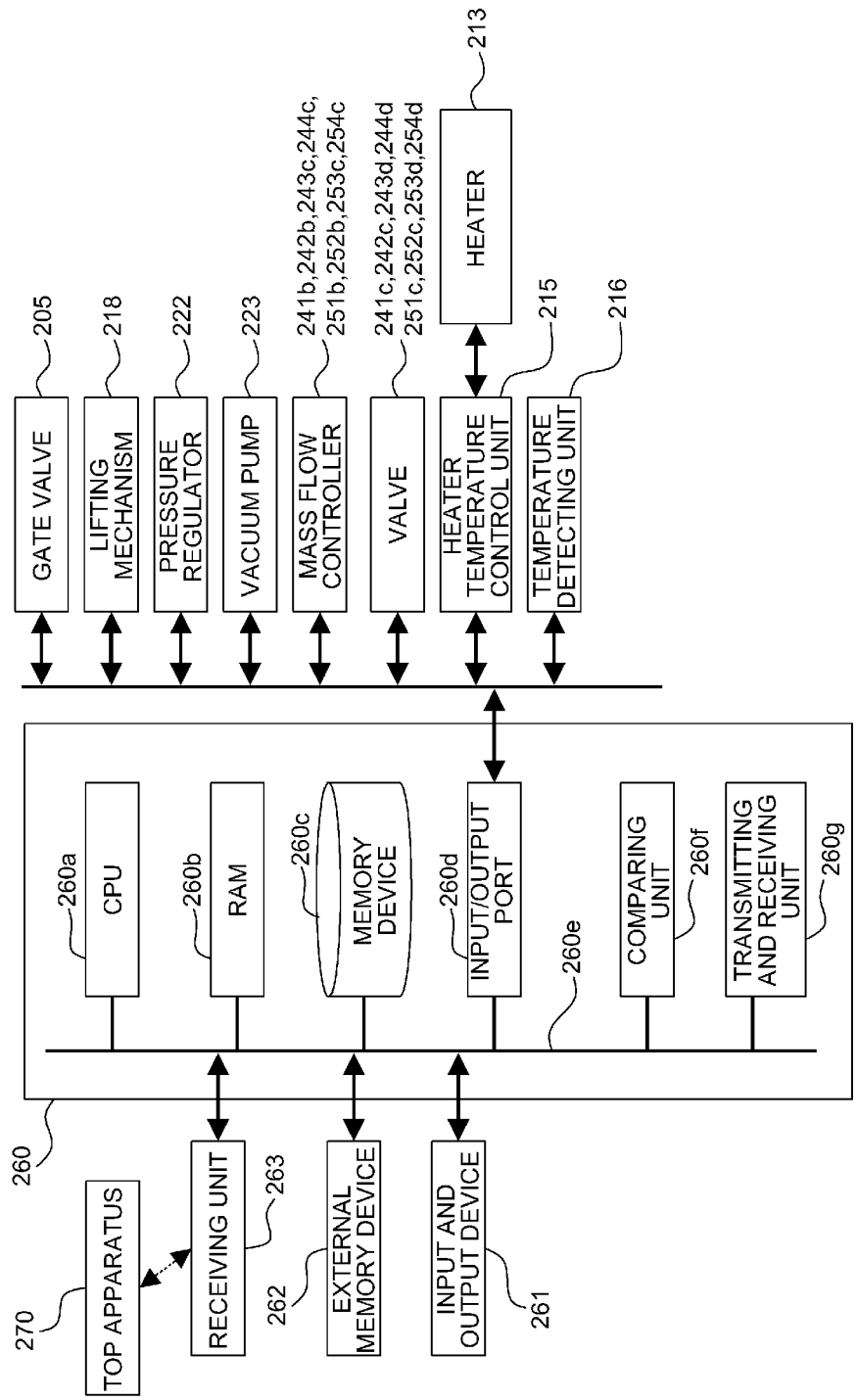
FIG. 20 is a diagram schematically illustrating a controller according to the embodiment of the present invention.

The controller 260 is schematically illustrated in FIG. 20. The controller 260 serving as a control unit (a control device) is configured as a computer that includes a central processing unit (CPU) 260a, a random access memory (RAM) 260b, a memory device 260c, an input-and-output (I/O) port 260d, a comparing unit 260f and a transmitting and receiving unit 260g. The RAM 260b, the memory device 260c and the I/O port 260d are configured to be capable of exchanging data with the CPU 260a through an internal bus 260e by an instruction of the transmitting and receiving unit 260g. For example, an input and output device 261 including a touch panel and the like or an external memory device 262 is configured to be capable of connecting to the controller 260. Also, a receiving unit 263 is installed which is electrically connected to the host apparatus 270 through a network. The receiving unit 263 is configured to be capable of receiving information on the other apparatus from the host apparatus 270.

The memory device 260c is configured as, for example, a flash memory, a hard disk drive (HDD) and the like. A control program for controlling operations of the substrate processing apparatus, a program recipe storing sequences or conditions of substrate processing to be described later, a table for comparing a control value of the detected film thickness to that of the detected temperature, a table for comparing a control value of the detected film thickness to that of the detected gas supply and the like are readably stored in the memory device 260c. Also, a process recipe which is a combination of sequences causes the controller 260 to execute each sequence in a substrate processing process to be described later in order to obtain a predetermined result and functions as a program. Hereinafter, such a program recipe, a control program and the like are collectively and simply called a "program." Also, when the term "program" is used in this specification, it may refer to one or both of the program recipe and the control program. Also, the RAM 260b is configured as a memory area (a work area) in which program, data and the like read by the CPU 260a are temporarily stored.

The I/O port 260d is connected to the gate valve 205, the lifting mechanism 218, the heater 213, the pressure regulator 222, the vacuum pump 223 and the like. Also, the I/O port 260d may by connected to the mass flow controllers 241b, 242b, 243c, 244c, 251b, 252b, 253c and 254c, the valves 241c, 242c, 243d, 244d, 251c, 252c, 253d and 254d and the like.

The CPU 260a is configured to read and execute the control program from the memory device 260c and read the process recipe from the memory device 260c according to an input of a manipulating command from the I/O device 261, etc. Also, to comply with the content of the read process recipe, the CPU 260a is configured to control through the transmitting and receiving unit 260g an opening or closing operation of the gate valve 205, a lifting operation of the lifting mechanism 218, a power supply operation to the heater 213, a pressure adjusting operation by the pressure regulator 222, ON/OFF control of the vacuum pump 223, a flow rate adjusting operation by the mass flow controller, the valve and the like.

Also, the controller 260 is not limited to being configured as a dedicated computer and may be configured as a general-purpose computer. For example, the controller 260 according to the present embodiment may be configured by preparing the external memory device 262 (e.g., a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card) recording the above program and then installing the program in the general-purpose computer using the external memory device 262. Also, the method of supplying the program to the computer is not limited to supplying through the external memory device 262. For example, a communication line such as the Internet or a dedicated line may be used to supply the program regardless of the external memory device 262. Also, the memory device 260c or the external memory device 262 is configured as a non-transitory computer-readable recording medium. Hereinafter, these are also collectively referred to simply as a recording medium. Also, when the term "recording medium" is used in this specification, it refers to one or both of the memory device 260c and the external memory device 262.

Also, although the case in which the receiving unit 263 of the present embodiment receives the information on other apparatuses from the host apparatus 270 is described, the present invention is not limited thereto. For example, information may be directly received from the other apparatuses. Also, the information on the other apparatus is input through the input and output device 261 and may be controlled based thereon. Also, the information on the other apparatuses may be stored in the external memory device, and the information on the other apparatus may be received from the external memory device.

Next, a method of forming an insulating film using the substrate processing apparatus 900 will be described. After the process of measuring the thickness of the second insulating film (S108), the measured wafer 200 is loaded into the substrate processing apparatus 900. Also, in the description below, the controller 260 controls the operations of the respective units included in the substrate processing apparatus 900.

(Substrate Loading Process)

In the process of measuring the thickness of the second insulating film (S108), when a thickness of the first insulating film 2013 is measured, the wafer 200 is loaded into the substrate processing apparatus 900. Specifically, the substrate support 210 is lowered by the lifting mechanism 218, and the lift pins 207 protrude above an upper surface of the substrate support 210 from the through-holes 214. Also, after the pressure in the process chamber 201 is adjusted to a predetermined pressure, the gate valve 205 is opened, and the wafer 200 is placed from the gate valve 205 on the lift pins 207. After the wafer 200 is placed on the lift pins 207, the wafer 200 is placed from the lift pins 207 on the substrate support 210 by lifting the substrate support 210 to a predetermined position by the lifting mechanism 218.

(Pressure Decreasing and Temperature Increasing Process)

Next, the process chamber 201 is exhausted through the exhaust pipe 224, so that the process chamber 201 has a predetermined pressure (degree of vacuum). In this case, the controller 260 feedback controls a degree of an opening of an auto pressure controller (APC) valve serving as the pressure regulator 222 based on a pressure value measured by a pressure sensor. Also, the controller 260 feedback controls an amount of power supplied to the heater 213, so that the process chamber 201 has a predetermined temperature based on a temperature value measured by the temperature detecting unit 216. Specifically, the substrate support 210 is pre-heated by the heater 213, and then the substrate support unit 210 is left for a predetermined time after a temperature of the wafer 200 or the substrate support unit 210 stops changing. During that time, when there is remaining moisture in the process chamber 201 or a gas discharged from the component, the remaining moisture or the gas may be vacuum-exhausted or removed by purging by the supply of an inert gas. Through this, the preparation before the film forming process is completed. Also, when the process chamber 201 is exhausted to a predetermined pressure, the process chamber 201 may be vacuum-exhausted to a degree of vacuum that can be reached in a single attempt.

After the wafer 200 is placed on the substrate support 210 and the atmosphere in the process chamber 201 is stabilized, the controller 260 operates the mass flow controllers 241b, 242b, 251b and 252b, and adjusts degrees of openings of the valves 241c, 242c, 251c and 252c. In this case, the controller 260 may operate the mass flow controller 243c, the mass flow controller 244c, the mass flow controller 253c and the mass flow controller 254c, and may adjust degrees of openings of the valve 243d, the valve 244d, the valve 253d and the valve 254d.

(Gas Supply Process)

In a gas supply process, a gas is supplied into the process chamber 201 through the first gas supply system and the second gas supply system.

When the gas is supplied, the controller 260 controls each of an amount (or a concentration) of the process gas supplied to the center portion of the wafer 200 and an amount (or a concentration) of the process gas supplied to the peripheral portion by controlling the mass flow controllers or the valves of the first gas supply system and the second gas supply system according to the measured data of the thickness of the insulating film 2013 received from the host apparatus 270. More preferably, the controller 260 controls the center-zone heater 213a and the outer-zone heater 213b according to the measured data received from the host apparatus 270 to control a temperature gradient on the wafer 200.

The gas supplied into the process chamber 201 is decomposed in the process chamber 201, and then the third insulating film 2015 is formed on the polished second insulating film 2013.

After a predetermined time has elapsed, the controller 260 closes each of the valves to stop the supply of the gases.

The temperature of the heater 213 at this time is set to a temperature such that there is no negative influence on pre-formed components such as a gate electrode 203. Specifically, the controller 260 sets the temperature of the heater 213, so that the temperature is within a temperature range in which components of the metal film 2009 may not diffuse into the components in the vicinity. More preferably, the controller 260 sets the temperature of the heater 213, so that the temperature is within a temperature range in which the dielectric constants of the barrier insulating film 2012 and the barrier metal film 2021 formed in the vicinity of the metal film 2009 may be within a required range. The controller 260 sets the temperature of the heater 213, so that the wafer 200 is at, for example, a predetermined temperature ranging from 300° C. to 450° C.

For example, as the controller 260 sets the temperature of the wafer 200 to 300° C. or higher, the degradation of the film or the increase in the dielectric constant of the already formed barrier insulating film 2012 is suppressed. When the temperature of the wafer 200 is set to less than 300° C., since a film density of the barrier insulating film 2012 is decreased, a component of the metal film 2009, for example, a copper component is easily diffused into the insulating film 2013 and the like. Since silicon (Si) which is a main component of the insulating film 2013 is a material into which the copper component is easily diffused, it is difficult to control a diffusion state on the wafer 200. When the copper component is diffused, a variation in the characteristic occurs between the wirings on the wafer 200. Thus, the controller 260 suppresses the diffusion of the component of the metal film 2009 into the insulating film 2013 and the like by setting the temperature of the wafer 200 to 300° C. or higher.

Also, when the controller 260 sets, for example, the temperature of the wafer at 200 to 450° C. or less, a film density of the barrier metal film 2021 illustrated in FIG. 5C is decreased, and the diffusion of the component of the metal film 2009, for example, the copper component, to the metal film 2009 and the like is suppressed. When the temperature of the wafer 200 is greater than 450° C., since the film density of the barrier metal film 2021 is decreased, the component of the metal film 2009, for example, the copper component, is easily diffused into the insulating film 2007 and the like. Since silicon (Si) which is a main component of the insulating film 2007 is a material into which the copper component is easily diffused, it is difficult to control a diffusion state on the wafer 200. Therefore, the copper component is diffused, a variation in the characteristic occurs between the wirings on the wafer 200. Thus, when the controller 260 sets the temperature of the wafer at 200 to 450° C. or less, the diffusion of the components of the metal film 2009 into the insulating film 2007 and the like is suppressed.

As the inert gas, in addition to the He gas, a gas which do not have adverse effects on the film may be used, and for example, rare gases such as Ar, $N_2$, Ne, Xe and the like may also be used.

(Substrate Unloading Process)

After the gas supply process is completed, the substrate support 210 is lowered by the lifting mechanism 218, and the lift pins 207 protrude above the upper surface of the substrate support 210 from the through-holes 214. Also, after the pressure in the process chamber 201 is adjusted to a predetermined pressure, the gate valve 205 is opened, and the wafer 200 is transferred from the lift pins 207 to the outside of the gate valve 205.

Next, a method of controlling a thickness of the third interlayer insulating film 2015 using the present apparatus will be described. As described above, after the polishing process (S107) is completed, the thickness of the second insulating film 2013 in the center portion of the wafer 200 is different from that of the second insulating film 2013 in the peripheral portion. In the process of measuring the thickness of the second insulating film (S108), a thickness distribution thereof is measured. Measured results are stored in the RAM 260b through the host apparatus 270. The stored data are compared to the recipe stored in the memory device 260c by the comparing unit 260f, and the apparatus is controlled based on a control value in the recipe.

Next, the case in which the data which is received from the host apparatus and stored in the RAM 260b is the distribution A will be described. The case of the distribution A refers to the case in which a thickness of the insulating film 2013a is greater than that of the insulating film 2013b as illustrated in FIGS. 12A and 12B.

In the case of the distribution A, in the present process, the controller 260 controls a film thickness of the third interlayer insulating film 2015, so that a thickness of the insulating film 2015b formed in the peripheral portion of the wafer 200 is large and a thickness of the insulating film 2015a formed in the center portion of the wafer 200 is smaller than that of the insulating film 2015b. Specifically, when the gas is supplied, the controller 260 controls the gas supply system, so that an amount of a silicon-containing gas supplied to the peripheral portion of the wafer 200 is greater than that of the silicon-containing gas supplied to the center portion of the wafer 200. Thus, the height of the insulating film of the present semiconductor device, that is, the thickness of the stacked insulating film in which the insulating film 2015 is stacked on the insulating film 2013, may be compensated to be the same as the target thickness distribution A' illustrated in FIG. 13. That is, the thickness of the stacked insulating film may be compensated to be the same as the thickness distribution A'.

Specifically, first, the comparing unit 260f reads a table from the memory device 260c. The comparing unit 260f compares the read data to the received thickness distribution to select a control value for each of the mass flow controllers. Then, the transmitting and receiving unit 260g transmits the control value to each of the mass flow controllers through the I/O port 260d. Each of the mass flow controllers controls a flow rate of the gas by adjusting to be the received control value.

In this case, the controller 260 controls the mass flow controller 241b of the first gas supply system and a degree of an opening of the valve 241c based on the received control value to control an amount of the silicon-containing gas supplied into the process chamber 201 through the shower head 234. Also, the controller 260 controls the mass flow controller 242b and a degree of an opening of the valve 242c, and thus the silicon-containing gas is supplied into the process chamber 201 through the gas supply path 235. The controller 260 controls the amount of exposure to the silicon-containing gas per unit area of a processing surface of the wafer 200, so that an amount of exposure to the gas supplied through the gas supply path 235 is greater than an amount of exposure to the gas supplied through the shower head. The term "amount of exposure" used herein refers to "amount of exposure to a main component of a process gas." In the present embodiment, the process gas is the silicon-containing gas, and the main component is silicon.

Also, the controller 260 controls the mass flow controller 251b of the second gas supply system and a degree of an opening of the valve 251c based on the received control value to control an amount of the oxygen-containing gas supplied through the shower head 234. The amount of the oxygen-containing gas of the gas supply pipe 251a corresponds to the amount of the silicon-containing gas of the gas supply pipe 241a. Also, the controller 260 controls the mass flow controller 252b of the second gas supply system and a degree of an opening of the valve 252c, and thus the oxygen-containing gas is supplied through the gas supply path 235. The amount of the oxygen-containing gas of the gas supply pipe 252a corresponds to the amount of the silicon-containing gas of the gas supply pipe 242a.

In this case, the controller 260 controls the amount of exposure to the silicon-containing gas per unit area of the processing surface of the wafer 200 through the first gas supply system, so that the amount of exposure to the gas supplied through the gas supply path 235 is greater than the amount of exposure to the gas supplied through the shower head 234. The term "amount of exposure" used herein is referred to as "amount of exposure to a main component of a process gas." In the present embodiment, the process gas is the silicon-containing gas, and the main component is silicon.

The silicon-containing gas and the oxygen-containing gas which are supplied through the shower head 234 are supplied onto the insulating film 2013a formed on the center portion of the wafer 200. As illustrated in FIGS. 12A and 12B, the insulating film 2015a is formed on the insulating film 2013a by the supplied gas.

The silicon-containing gas and the oxygen-containing gas which are supplied through the gas supply path 235 are supplied onto the insulating film 2013b formed on the peripheral portion of the wafer 200. As illustrated in FIGS. 12A and 12B, the insulating film 2015b is formed on the insulating film 2013b by the supplied gas.

As described above, since the amount of exposure to the silicon-containing gas per unit area of the processing surface of the wafer 200 on the insulating film 2013b is greater than the amount of exposure to the silicon-containing gas per unit area of the wafer 200 on the insulating film 2013a, the controller 260 may control the thickness of the insulating film 2015b to be greater than that of the insulating film 2015a.

In this case, as illustrated in FIGS. 12A and 12B, the controller 260 controls the thickness of the insulating film 2015, so that a thickness H1b of a film in which the insulating film 2015b is stacked on the insulating film 2013b is substantially the same as a thickness H1a of a film in which the insulating film 2015a is stacked on the insulating film 2013a. More preferably, the controller 260 controls the thickness of the insulating film 2015, so that a difference between a distance from a surface of the substrate 200 to an upper end of the insulating film 2015b and a distance from the surface of the substrate 200 to an upper end of the insulating film 2015a is within a predetermined range. Also, more preferably, the controller 260 controls the thickness distribution of the third insulating film 2015, so that a distribution of a height (an upper end of the third interlayer insulating film) of the insulating film 2015 is within a predetermined range on the substrate.

Also, alternatively, as a supply amount of the silicon-containing gas of the gas supply pipe 241a is the same as that of the silicon-containing gas of the gas supply pipe 242a, the controller 260 may instead control the concentration of the silicon-containing gas of each of the gas supply pipe 241a and the gas supply pipe 242a. When controlling the concentration of the silicon-containing gas, the controller 260 controls the concentration of the silicon-containing gas passing through the gas supply pipe 241a and the gas supply pipe 242a by controlling the first inert gas supply system. In the distribution A, the controller 260 decreases the concentration of the silicon-containing gas passing through the gas supply pipe 241a and sets the concentration of the silicon-containing gas passing through the gas supply pipe 242a to be greater than the concentration of the silicon-containing gas passing through the gas supply pipe 241a.

Specifically, when receiving information on the thickness distribution A, the comparing unit 260f reads a table. The comparing unit 260f compares the read table to the received thickness distribution to select a control value of each of the mass flow controllers 241b, 243c, 242b, 244c, 251c, 253c, 252b and 254c. Then, the transmitting and receiving unit 260g transmits the control value to each of the mass flow controllers through the I/O port 260d. Each of the mass flow controllers controls the flow rate of the gas such that the gas is adjusted to be the received control value.

In this manner, the controller 260 may more precisely control the amount of exposure to the silicon-containing gas per unit area of the processing surface of the wafer 200, so that the amount of the gas supplied through the gas supply path 235 is greater than the amount of the gas supplied through the shower head 234. By controlling in this manner, it becomes possible to more reliably control the thickness of the insulating film 2015b to be greater than that of the insulating film 2015a.

More preferably, the controller 260 may control the supply amount of the silicon-containing gas of the gas supply pipe 241a to be different from the supply amount of the silicon-containing gas of the gas supply pipe 242a, and the concentration of the silicon-containing gas of the gas supply pipe 241a to be different from the concentration of the silicon-containing gas of the gas supply pipe 242a. By controlling in this manner, the silicon-containing gas may be supplied to have an even larger difference in the amount of exposure to the silicon-containing gas per unit area. That is, the thickness of the insulating film 2015a may be even more significantly different from that of the insulating film 2015b. Therefore, in the second insulating film polishing process (S107), even when a difference between the heights of the insulating film 2013a and the insulating film 2013b becomes large, it becomes possible to match the heights thereof.

Also, more preferably, as described above, the controller 260 controls to remove the process gas, and in parallel, may control the center-zone heater 213a and the outer-zone heater 213b. In this case, the comparing unit 260f compares the read table to the received thickness distribution to select a control value of each of the mass flow controllers 241b, 243c, 242b, 244c, 251c, 253c, 252b and 254c and a control value of each of the heaters 213a and 213b. Then, the transmitting and receiving unit 260g transmits the control value to each of the mass flow controllers through the I/O port 260d. Each of the mass flow controllers adjusts to be the received control value to control the flow rate of the gas. Also, the transmitting and receiving unit 260g transmits the control value to the heater temperature control unit 215 through the I/O port 260d to control the wafer 200 to have a desired temperature distribution.

In parallel, when the controller 260 controls the inert gas supply system, the comparing unit 260f also reads the table in the same manner. The comparing unit 260f compares the read table to the received thickness distribution to select a control value of each of the mass flow controllers 241b, 243c, 242b, 244c, 251c, 253c, 252b and 254c and a control value of each of the heaters 213a and 213b. Then, the transmitting and receiving unit 260g transmits the control value to each of the mass flow controllers through the I/O port 260d. Each of the mass flow controllers adjusts to be the received control value to control the flow rate of the gas. Also, the transmitting and receiving unit 260g transmits the control value to the heater temperature control unit 215 through the I/O port 260d to control the wafer 200 to have a desired temperature distribution.

Since the thickness of the formed film is proportional to the temperature, in the distribution A, the heater temperature control unit 215 increases the temperature of the outer-zone heater 213b to be greater than that of the center-zone heater 213a. For example, this control is effective in the case of forming the insulating film 2015 using a gas such as disilane gas for which the film forming efficiency largely depends on the temperature condition.

In this manner, when concurrently controlling the supply amount (concentration) of the process gas and the temperature, it is possible to more precisely control the thickness of the film.

Next, the case in which the data stored in the RAM 260b is the distribution B will be described. The case of the distribution B refers to the case in which a thickness of the insulating film 2013b is greater than that of the insulating film 2013a as illustrated in FIG. 14.

In the case of the distribution B, in the present process, the controller 260 controls the thickness of the third interlayer insulating film 2015, so that the thickness of the insulating film 2015a formed in the center portion of the wafer 200 is large, and the thickness of the insulating film 2015b formed in the peripheral portion of the wafer 200 is smaller than that of the insulating film 2015a. Specifically, when the gas is supplied, the controller 260 controls the gas supply system, so that the amount of the silicon-containing gas supplied to the center portion of the wafer 200 is greater than that of the silicon-containing gas supplied to the peripheral portion of the wafer 200. Thus, the height of the insulating film of the present semiconductor device, that is, the height of the stacked insulating film in which the insulating film 2015 is stacked on the insulating film 2013, may be compensated to be the same as a target thickness distribution B' illustrated in FIG. 15. That is, the thickness of the stacked insulating film may be compensated to be the same as the thickness distribution B'.

Specifically, first, the comparing unit 260f reads the table from the memory device 260c. The comparing unit 260f compares the read data to the received thickness distribution to select the control value of each of the mass flow controllers. Then, the transmitting and receiving unit 260g transmits the control value to each of the mass flow controllers through the I/O port 260d. Each of the mass flow controllers adjusts and controls the flow rate of the gas to be the received control value.

In this case, the controller 260 controls the mass flow controller 241b of the first gas supply system and the degree of the opening of the valve 241c based on the received control value to control the amount of the silicon-containing gas supplied into the process chamber 201 through the shower head 234. Also, the controller 260 controls the mass flow controller 242b and the degree of the opening of the valve 242c, and thus the silicon-containing gas is supplied into the process chamber 201 through the gas supply path 235. The controller 260 controls the amount of exposure to the silicon-containing gas per unit area of the processing surface of the wafer 200, so that the amount of exposure to the gas supplied by the first gas supply system and the shower head 234 is greater than the amount of exposure to the gas supplied through the gas supply path 235.

Also, the controller 260 controls the mass flow controller 251b of the second gas supply system and the degree of the opening of the valve 251c based on the received control value to control the amount of the oxygen-containing gas supplied through the shower head 234. The amount of the oxygen-containing gas of the gas supply pipe 251a is set corresponding to the amount of the silicon-containing gas of the gas supply pipe 241a. Also, the controller 260 controls the mass flow controller 252b and the opening of the valve 252c, and thus the oxygen-containing gas is supplied through the gas supply path 235. The amount of the oxygen-containing gas of the gas supply pipe 252a is set corresponding to the amount of the silicon-containing gas of the gas supply pipe 242a.

In this case, the controller 260 controls the amount of exposure to the silicon-containing gas per unit area of the processing surface of the wafer 200, so that the amount of exposure to the gas supplied through the second gas supply system and the shower head 234 is greater than the amount of exposure to the gas supplied through the gas supply path 235.

The silicon-containing gas and the oxygen-containing gas which are supplied through the shower head 234 are supplied onto the insulating film 2013a formed on the center portion of the wafer 200. As illustrated in FIG. 14, the insulating film 2013a is formed on the insulating film 2015a by the supplied gas.

The silicon-containing gas and the oxygen-containing gas which are supplied through the gas supply path 235 are supplied onto the insulating film 2013b formed on the peripheral portion of the wafer 200. As illustrated in FIG. 14, the insulating film 2015b is formed on the insulating film 2013b by the supplied gas.

As described above, since the amount of exposure to the silicon-containing gas per unit area of the processing surface of the wafer 200 on the insulating film 2013a is greater than the amount of exposure to the silicon-containing gas per unit area of the wafer 200 on the insulating film 2013b, the thickness of the insulating film 2015a may become greater than that of the insulating film 2015b.

In this case, as illustrated in FIG. 14, the thickness of the insulating film 2015 is controlled, so that the thickness H1b of a film in which the insulating film 2015b is stacked on the insulating film 2013b is substantially the same as the thickness H1a of a film in which the insulating film 2015a is stacked on the insulating film 2013a. More preferably, the controller 260 controls the thickness of the insulating film 2015, so that the difference between the distance from the surface of the substrate 200 to the upper end of the insulating film 2015b and a distance from the surface of the substrate 200 to the upper end of the insulating film 2015a is within a predetermined range. Also, more preferably, the controller 260 controls the thickness distribution of the third insulating film 2015, so that the distribution of the height (the upper end of the third interlayer insulating film) of the insulating film 2015 on the substrate is within a predetermined range.

Also, alternatively, the supply amount of the gas supply pipe 241a may be made the same as that of the silicon-containing gas of the gas supply pipe 242a of the first gas supply system, and the controller 260 may instead control the concentration of the silicon-containing gas of each of the gas supply pipe 241a and the gas supply pipe 242a. When controlling the concentration of the silicon-containing gas, the controller 260 controls the concentration of the silicon-containing gas passing through the gas supply pipe 241a and the gas supply pipe 242a by controlling the first inert gas supply system. In the distribution B, the controller 260 decreases the concentration of the silicon-containing gas passing through the gas supply pipe 242a and sets the concentration of the silicon-containing gas passing through the gas supply pipe 241a to be greater than the concentration of the silicon-containing gas passing through the gas supply pipe 242a.

Specifically, when information on the thickness distribution B is received, the comparing unit 260f reads the table. The comparing unit 260f compares the read table to the received thickness distribution to select a control value of each of the mass flow controllers 241b, 243c, 242b, 244c, 251c, 253c, 252b and 254c. Then, the transmitting and receiving unit 260g transmits the control value to each of the mass flow controllers through the I/O port 260d. Each of the mass flow controllers adjusts and controls the flow rate of the gas to be the received control value.

In this manner, the controller 260 may more precisely control the amount of exposure to the silicon-containing gas per unit area of the processing surface of the wafer 200, so that the amount of the gas supplied through the shower head 234 is greater than the amount of the gas supplied through the gas supply path 235. By controlling in this manner, it becomes possible to more reliably control the thickness of the insulating film 2015a to be greater than that of the insulating film 2015b.

More preferably, in addition to having the supply amount of the silicon-containing gas of the gas supply pipe 251a to be different from that of the gas supply pipe 252a, the controller 260 may control the concentrations thereof to be different. In this case, after reading the table, the comparing unit 260f compares the read table to the received thickness distribution to select the control value of each of the mass flow controllers 241b, 243c, 242b, 244c, 251c, 253c, 252b and 254c and a control value of each of the heaters 213a and 213b. Then, the transmitting and receiving unit 260g transmits the control value to each of the mass flow controllers through the I/O port 260d. Each of the mass flow controllers adjusts and controls the flow rate of the gas to be the received value. Also, the transmitting and receiving unit 260g transmits the control value to the heater temperature control unit 215 through the I/O port 260d to control the wafer 200 to have a desired temperature distribution.

In parallel, when the controller 260 controls the inert gas supply system, the comparing unit 260f reads the table in the same manner. The comparing unit 260f compares the read table to the received thickness distribution to select the control value of each of the mass flow controller 241b, 243c, 242b, 244c, 251c, 253c, 252b and 254c and the control value of each of the heaters 213a and 213b. Then, the transmitting and receiving unit 260g transmits the control value to each of the mass flow controllers and each of the heaters through the I/O port 260d. Each of the mass flow controllers adjusts and controls the flow rate of the gas to be the received value. Also, the transmitting and receiving unit 260g transmits the control value to the heater temperature control unit 215 through the I/O port 260d to control the wafer 200 to have a desired temperature distribution.

By controlling in this manner, the controller 260 may provide the silicon-containing gas that have an even larger difference in the amount of exposure to the silicon-containing gas per unit area. That is, the thickness of the insulating film 2015a may be even more significantly different from that of the insulating film 2015b. Therefore, in the second insulating film polishing process (S107), even when a difference between the heights of the insulating film 2013a and the insulating film 2013b becomes large, it becomes possible to match the heights thereof.

Also, more preferably, as described above, the controller 260 controls to remove the process gas and, in parallel, may control the center-zone heater 213a and the outer-zone heater 213b. Since the thickness of the formed film is proportional to the temperature, in the distribution B, the heater temperature control unit 215 sets the temperature of the center-zone heater 213a to be greater than that of the outer-zone heater 213b. For example, it is effective in the case of forming the insulating film 2015 using a gas such as disilane gas for which the temperature condition largely contributes to the film forming efficiency.

In this manner, when concurrently controlling the supply amount (concentration) of the process gas and the temperature, it becomes possible to more precisely control the thickness of the film.

As described above, the controller 260 may control the thickness of the third insulating film 2015 in each of the center portion and the peripheral portion of the wafer 200 by tuning the amount of exposure to the silicon-containing gas per unit area of the processing surface of the wafer 200.

In this case, the controller 260 controls the thickness of the insulating film 2015, so that the thickness of the film in which the insulating film 2015b is stacked on the insulating film 2013b is the same as that of the film in which the insulating film 2015a is stacked on the insulating film 2013a.

[Process of Measuring the Thickness of the Film (S110)]

Next, a process of measuring a thickness of a film (S110) will be described. In the process of measuring the thickness of the film (S110), a height of a layer in which the second insulating film 2013 and the third insulating film 2015 are stacked is measured. Specifically, whether or not the height of the stacked layer is matched, that is, whether or not the thickness of the stacked insulating film is compensated to be the same as the target thickness distribution is determined. Here, the term "the heights are matched" is not limited to completely matching of the heights, and there may be a difference between the heights. For example, the difference between the heights may be within a range as long as without influencing the following patterning processes or the metal film forming processes.

After the third insulating film forming process (S109), the wafer 200 is loaded into the measuring apparatus. The measuring apparatus measures at least some portion of the center portion of the wafer 200 and the peripheral portion thereof which are susceptible to the influence on the polishing apparatus 400 and the thickness (the height) distribution of the insulating film 2015 is measured. The measured data are transmitted to the host apparatus 270. After the measurement, the wafer 200 is unloaded from the measuring apparatus. Even when the height distribution on the wafer 200 is within a predetermined range, specifically, within a range without influencing the following patterning process (S111) or the metal film forming process (S112), the process advances to the patterning process (S111). Also, in the case in which the thickness distribution is a predetermined distribution is known in advance, the process of measuring the thickness of the film (S110) may be omitted.

[Patterning Process (S111)]

Next, the patterning process (S111) will be described. After measuring the thickness of the film, the wafer 200 is patterned to have a desired pattern. The patterning process will be described in detail with reference to FIGS. 21A through 23B. Also, here, although the distribution A is described as an example, the present invention is not limited thereto. Needless to say, it is the same in the case of the distribution B.

The patterning process (S111) is performed by an exposure apparatus or an etching apparatus as a component of a second patterning system. The patterning process (S111) includes the exposure process performed by the exposure apparatus, an etching process performed by the etching apparatus and the like. After the wafer 200 loaded into the second patterning system is exposed, the stacked insulating film is patterned to have a predetermined pattern by the etching apparatus as illustrated in FIGS. 12A and 12B. Here, the through-holes 2016 are formed. After the etching process is completed, the wafer 200 is unloaded from the etching apparatus and the second patterning system. Here, a process of forming the through-hole 2016 is referred to as a through-hole forming process.

Figures 21A, 21B:
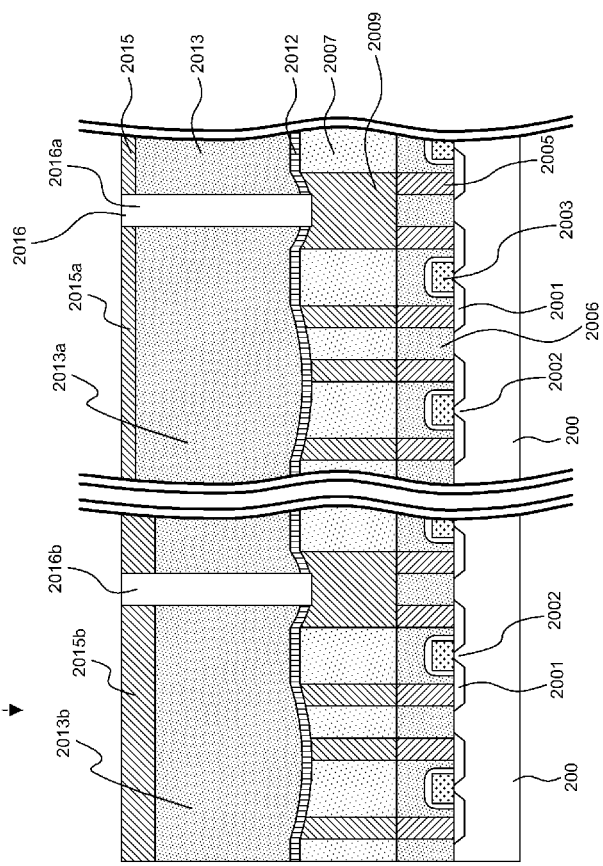
FIGS. 21A and 21B are views for describing the processing state of the wafer according to the embodiment of the present invention.

Specifically, in the present process, as illustrated in FIGS. 21A and 21B, the through-holes 2016 used as contact holes are formed in the stacked insulating film [a film in which the second insulating film 2013 and the third insulating film 2015 are stacked]. When the through-holes 2016 are formed, the barrier insulating film 2012 is etched to expose a portion of the metal film 2009. When etching, the processing is performed for a predetermined time by the etching apparatus for etching the barrier insulating film 2012. The metal film 2019 and the metal film 2009 to be described later are electrically connected to each other at an exposed portion of the metal film 2009. As described later, lower portions of the through-holes 2016 are formed as via-holes into which the metal film 2019 is embedded, and upper portions are formed as wiring grooves into which the metal film 2020 is embedded.

Figures 22A, 22B:
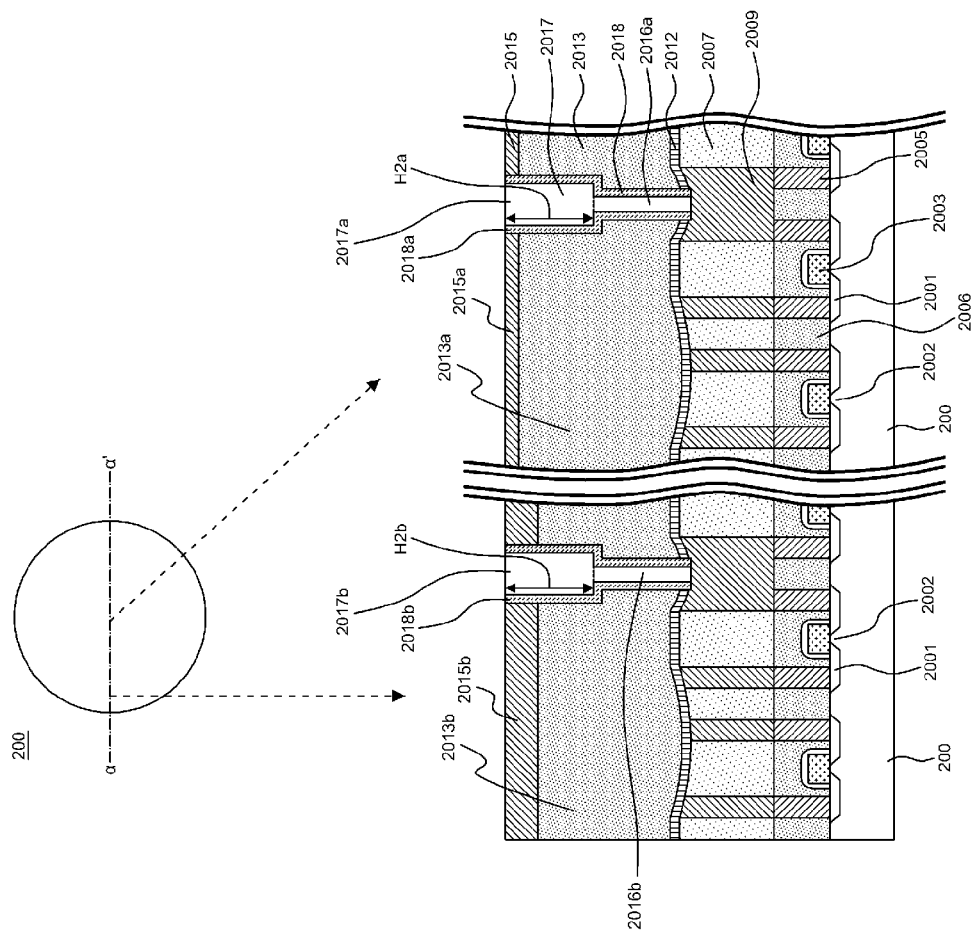
FIGS. 22A and 22B are views for describing the processing state of the wafer according to the embodiment of the present invention.

Next, as illustrated in FIGS. 22A and 22B, wiring grooves 2017 (referred to as second grooves) for disposing the metal film to be wired are formed. When forming the wiring grooves 2017, the wafer 200 is processed by the etching apparatus which forms the wiring grooves for the predetermined time. Here, a wiring groove 2017a having a height H2a is formed the center portion of the wafer 200. Also, a wiring groove 2017b having a height H2b is formed in the peripheral portion of the wafer 200. Since the height of the stacked insulating film in the center portion of the wafer 200 is the same as that of the stacked insulating film in the peripheral portion of the wafer 200, the height H2a and the height H2b are naturally and substantially the same. Also, the wiring grooves are used as a second layer of the semiconductor device. Here, a process of forming the wiring grooves is referred to as a wiring groove forming process.

[Metal Film Forming Process (S112)]

Figures 23A, 23B:
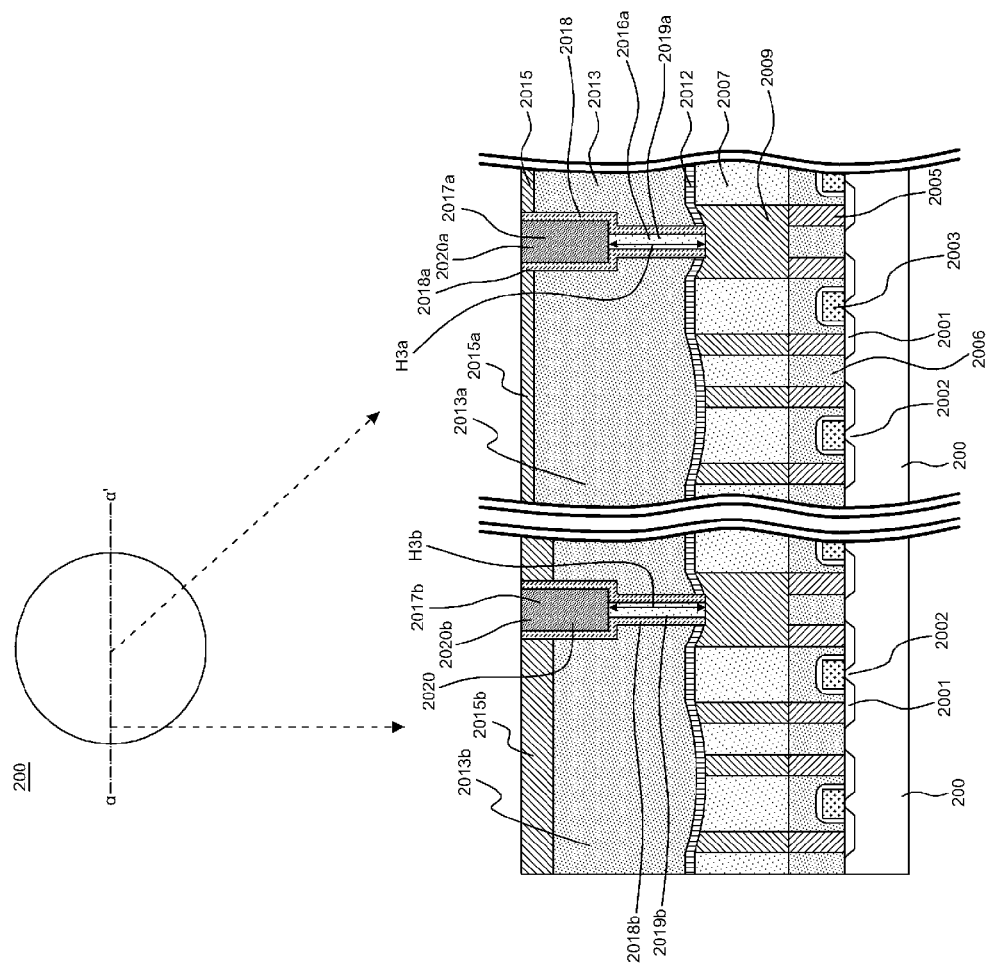
FIGS. 23A and 23B are views for describing the processing state of the wafer according to the embodiment of the present invention.

Next, a barrier metal film 2018 is formed in a surface of the through-hole 2016 or the wiring grooves 2017. Then, as illustrated in FIGS. 23A and 23B, the metal film 2019 used as a connection wiring (referred to as a via or a through-terminal) is embedded into the barrier metal film 2018, and the metal film 2020 [referred to as a wiring metal film 2020 or a wiring 2020] used as a wiring is embedded into the wiring grooves 2017. The metal film 2019 may have the same component as the metal film 2020. When metal film 2019 has the same component as the metal film 2020, the metal film 2019 and the metal film 2020 are formed in one film forming process. As the components of the metal film 2019 and the metal film 2020, for example, copper is used. In the metal film forming process (S112), since the connection wiring is formed, the metal film forming process (S112) may be referred to as a connection wiring forming process.

Also, here, a layer including the metal film 2019, the metal film 2020 and the insulating film 2013 is referred to as a second layer of a multilayer wiring layer. Also, the metal film 2020 is referred to as a second metal film, a second layer of a metal wiring, or an M2 layer.

As described above, by performing the substrate processing process including the third insulating film forming process (S109), a height of the through-hole 2016, which is used as a via-hole, between the M1 layer and the M2 layer may be uniform on the wafer 200. That is, a height H3a of the through-hole 2016a between the M1 layer and the M2 layer of the center portion of the wafer 200 and a height H3b of the through-hole 2016b between the M1 layer and the M2 layer of the peripheral portion of the wafer 200 may be matched. In this manner, since the height of the metal film 2019a of the center portion of the wafer 200 and the height of the metal film 2019b of the peripheral portion of the wafer 200 are matched, the characteristic of the metal film 2019 may be uniform on the wafer. Therefore, the characteristics of the many semiconductor devices produced from the wafer 200 may be uniform.

Also, the characteristic used herein refers to a characteristic which is proportional to the height of the metal film 2019, for example, refers to electrical capacitance and a resistance value.

[Polishing Process (S113)]

When the metal film forming process (S112) is completed, a polishing process for insulating the metal films from each other is performed as in the metal film polishing process (S104).

[Determination Process (S114)]

Whether or not a desired number of layers are formed on the wafer is determined. When it is determined that the desired number of layers are formed, the processing is completed. When it is determined that the desired number of layers are not formed, the processing advances to the barrier insulating film forming process (S105). The barrier insulating film forming process (S105) to the metal film polishing process (S113) are repeated until the desired number of layers are formed.

In the present embodiment, the M1 layer and the M2 layer are described as examples, but the present invention is not limited thereto. For example, M3 layer or more may also be applied.

Also, in the present embodiment, the case in which the lower layer and the upper layer are connected to each other in a gravity direction is described as an example, but the present invention is not limited thereto. For example, needless to say, applying to a three-dimensional stacked circuit 3 is also possible.

Next, a comparison will be described with reference to FIGS. 25A through 27B. A comparison example is the case in which the process of measuring the thickness of the second insulating film (S108) and the third insulating film forming process (S109) are not performed. That is, after the second insulating film polishing process (S107), the patterning process (S111) is performed. Therefore, the height of the insulating film or the height of the through-hole 2016 at the center portion of the wafer 200 is different from that at the peripheral portion.

Figures 25A, 25B:
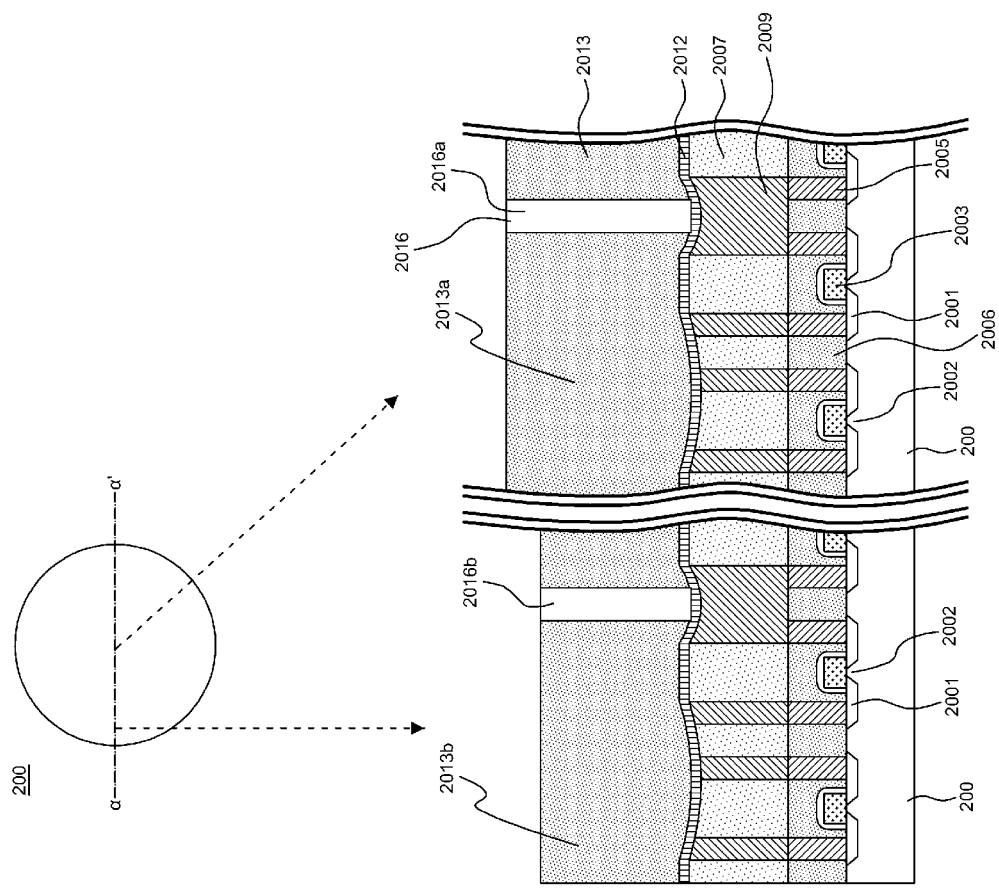
FIGS. 25A and 25B are views for describing a processing state of a wafer according to a comparative example.

The comparison will be described with reference to FIGS. 25A and 25B. FIGS. 25A and 25B are views where comparisons with FIGS. 21A and 21B are made. In FIGS. 25A and 25B, the height of the insulating film 2013 of the center portion of the wafer 200 is different from the height of the insulating film 2013 of the peripheral portion of the wafer 200 by the second insulating film polishing process (S107). That is, the height of the insulating film 2013a is different from that of the insulating film 2013b.

Figures 26A, 26B:
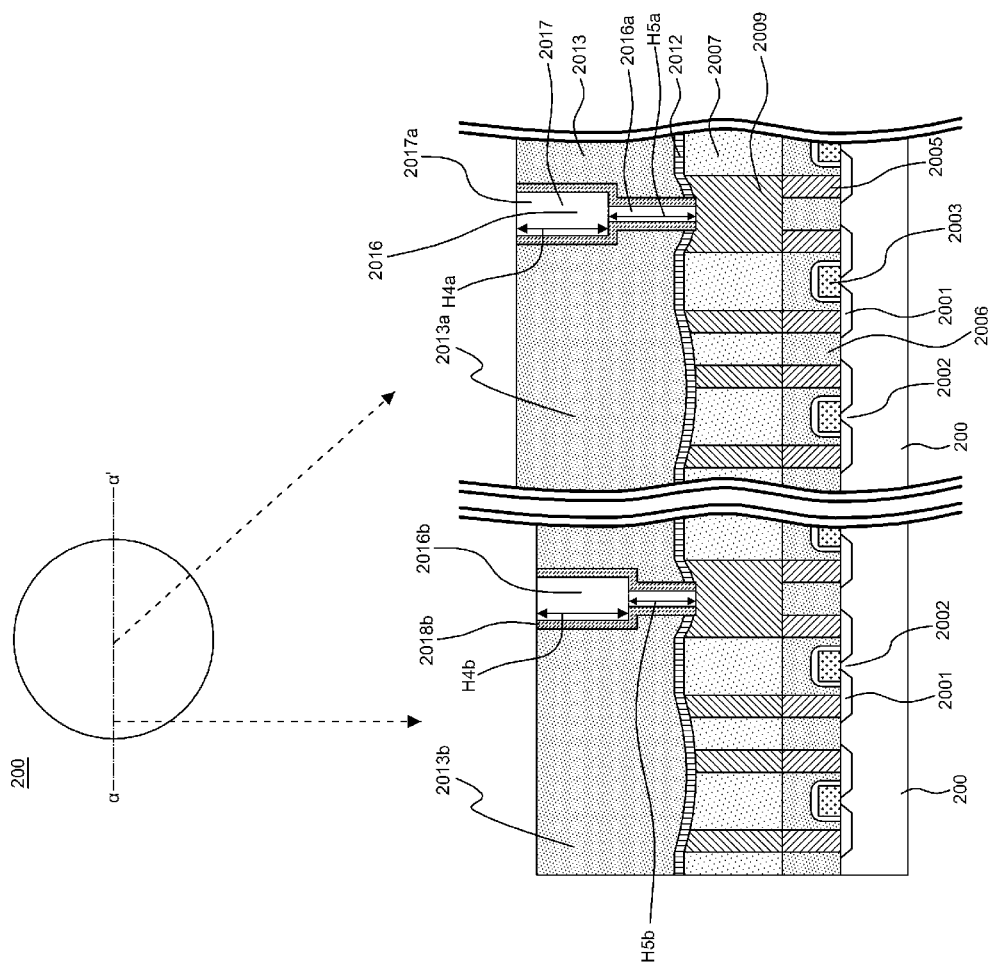
FIGS. 26A and 26B are views for describing the processing state of the wafer according to the comparative example.

An etching process for forming the wiring grooves 2017 on such a wafer 200 is performed. Since the etching process is performed for a predetermined time, a height H4a of wiring grooves 2017a in the inner peripheral portion of the wafer 200 and the height H4b of wiring grooves 2017b in the peripheral portion of the wafer 200 become uniform as illustrated in FIG. 26. However, since the height of the insulating film 2013 at the peripheral portion of the wafer 200 is different from the height of the insulating film 2013 at the center portion of the wafer 200, a height of the via-hole of the through-hole 2016 is changed. That is, a height H5a of the via-hole at the center portion of the wafer 200 is different from a height H5b at the via-hole of the peripheral portion of the wafer 200.

Figures 27A, 27B:
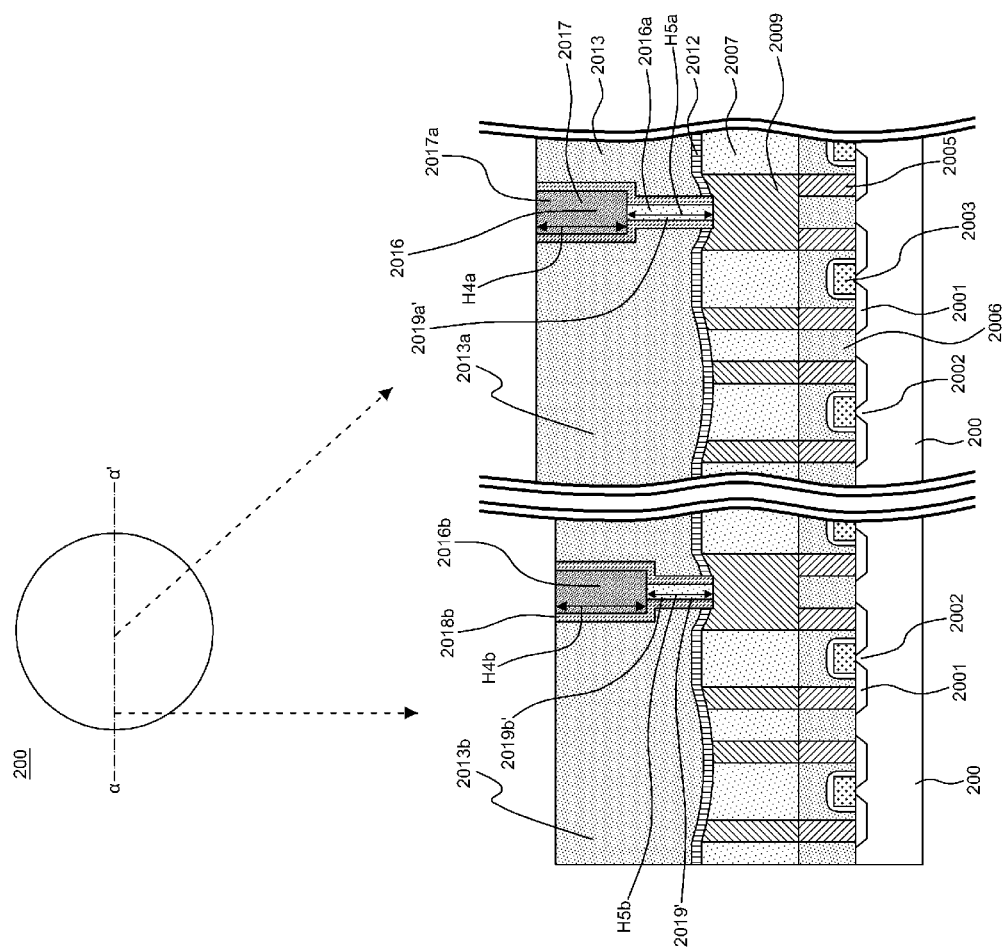
FIGS. 27A and 27B are views for describing the processing state of the wafer according to the comparative example.

Since the height of the via-hole at the center portion of the wafer 200 is different from the height at the via-hole of the peripheral portion of the wafer 200, a height of a metal film 2019' embedded in the via-hole at the center portion of the wafer 200 is different from the height of the metal film 2019' at the peripheral portion of the wafer 200 as illustrated in FIGS. 27A and 27B. Therefore, the characteristics that are proportional to the height such as electrical capacitance and a resistance value of a metal film 2019a' at the center portion of the wafer 200 is different from those at a metal film 2019b' of the peripheral portion of the wafer 200. Therefore, the characteristics of the many semiconductor devices produced from the wafer 200 may not be uniform.

On the other hand, in the present embodiment, since the process of measuring the thickness of the second insulating film (S108) and the third insulating film forming process (S109) is performed, the height of the metal film 2019 may be uniform on the wafer 200. Therefore, in comparison to the example in the comparison, since the semiconductor device having a uniform characteristic on the wafer 200 may be formed, it is possible to significantly contribute to improvement in yield.

Figure 24:
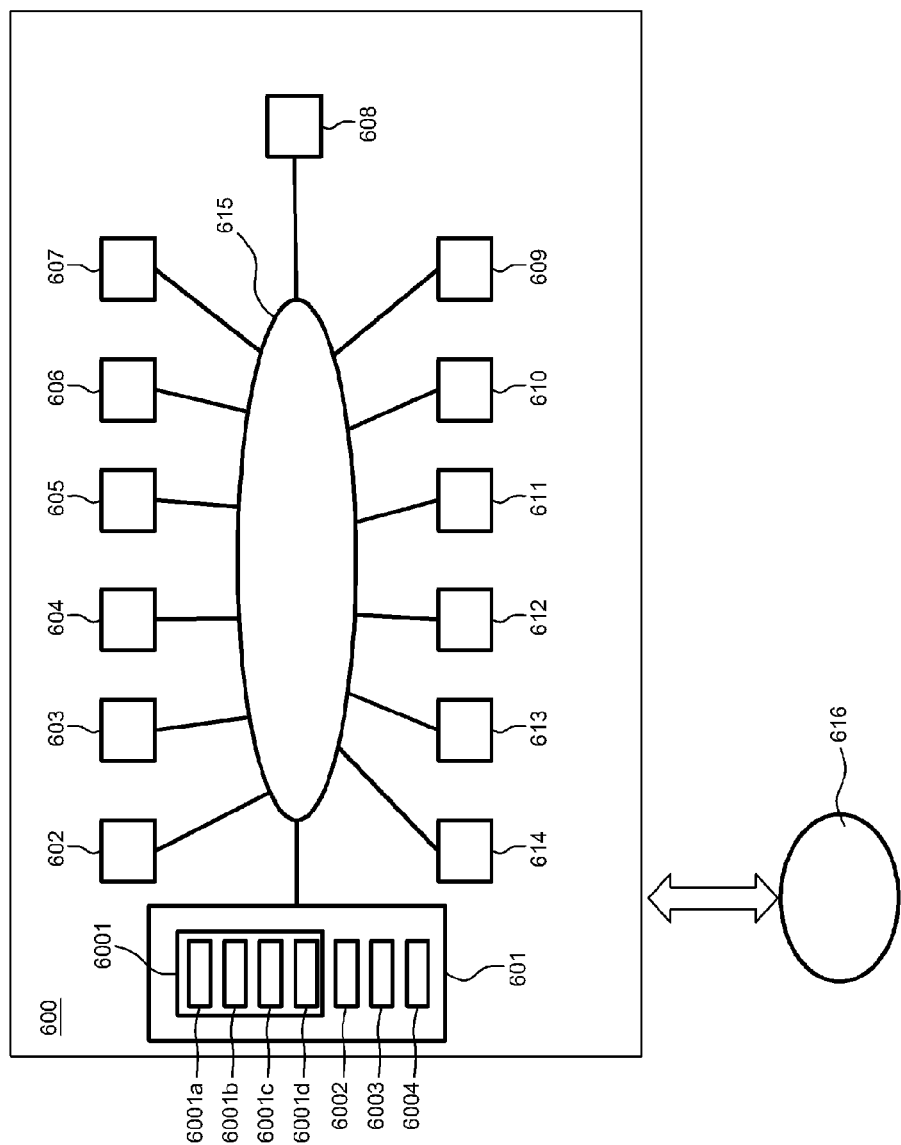
FIG. 24 is a view for describing a system according to the embodiment of the present invention.

Also, in the present embodiment, although a method in which the first insulating film process (S101) to the second metal film forming process are performed in the individual apparatus, the present embodiment is not limited thereto and may be performed in a single substrate processing system as illustrated in FIG. 24. Here, a substrate processing system 600 includes a host apparatus 601 for controlling each system, an insulating film forming apparatus 602 for performing the first insulating film forming process (S101), a first patterning system 603 for performing the patterning process (S102), a metal film forming system 604 for performing the metal film forming process (S103), a polishing apparatus 605 for performing the metal film polishing process (S104), a barrier insulating film forming apparatus 606 for performing the barrier insulating film forming process (S105), an insulating film forming apparatus 607 for performing the second insulating film forming process (S106), a polishing apparatus 608 for performing the second insulating film polishing process (S107) [corresponding to the polishing apparatus 400 in the present embodiment], a measuring apparatus 609 for performing the process of measuring the thickness of the second insulating film (S108), an insulating film forming apparatus 610 for performing the third insulating film forming process (S109) [corresponding to substrate processing apparatus 900 in the present embodiment], an apparatus of measuring a thickness of a film 611 for performing the process of measuring the thickness of the film (S110), a second patterning system 612 for performing the patterning process (S111), a metal film forming system 613 for performing the metal film forming process (S112) and a polishing apparatus 614 for performing the metal film polishing process (S113) as substrate processing apparatuses or substrate processing systems for processing the substrate. Also, the substrate processing system 600 includes a network for exchanging information with the apparatuses or the systems (615).

The host apparatus 601 includes a controller 6001 for controlling the transfer of information on each of the substrate processing apparatus or the substrate processing system.

The controller 6001 serving as a control unit (a control device) is configured as a computer that includes a CPU 6001a, an RAM 6001b, a memory device 6001c and an I/O port 6001d. The RAM 6001b, the memory device 6001c, the I/O port 6001d are configured to exchange data with the CPU 6001a through an internal bus. The I/O device 6002 including a touch panel or an external memory device 6003 may be connected to the host apparatus 601. Also, a transmitting and receiving unit 6004 for transmitting and receiving information through the other apparatus or the other system and the network is installed.

The memory device 6001c is configured as, for example, a flash memory, a hard disk drive (HDD) and the like. A program and the like for commanding the substrate processing apparatus to perform operations is readably stored in the memory device 6001c. Also, the RAM 6001b is configured as a memory area (a work area) in which program, data and the like read by the CPU 6001a are temporarily stored.

The CPU 6001a is configured to read and execute a control program from the memory device 6001c as well as read the program from a memory device 6003c according to an input of a manipulating command from the I/O device 6002. Also, to comply with the content of the read process recipe, the CPU 6001a is configured to control information transferring operations of each apparatus.

Also, the controller 6001 is not limited to being configured as a dedicated computer and may be configured as a general-purpose computer. For example, the controller 6001 according to the present embodiment may be configured by preparing the external memory device 6003 (e.g., a magnetic tape, a magnetic disk such as a flexible disk and a hard disk, an optical disc such as a CD and a DVD, a magneto-optical disc such as an MO, and a semiconductor memory such as a USB memory and a memory card) recording the above program, and then installing the program in the general-purpose computer using the external memory device 6003. Also, the method of supplying the program to the computer is not limited to supplying through the external memory device 6003. For example, a communication line such as the Internet or a dedicated line may be used to supply the program regardless of the external memory device 6003. Also, the memory device 6001c or the external memory device 6003 is configured as a non-transitory computer-readable recording medium. Hereinafter, these are also collectively referred to simply as a recording medium. Also, when the term "recording medium" is used in this specification, it refers to one or both of the memory device 6001c and the external memory device 6003.

An apparatus included in the system 600 may be appropriately selected, and any apparatuses in which functions are redundant may be combined into one apparatus. On the contrary, when throughput and the like are important, a plurality of apparatuses in which one process is performed may be installed. Also, the apparatus may be managed in another system rather than the present system 600. In this case, it is possible to perform the transfer to the other system through a higher level network 616.

Also, a program for controlling the insulating film forming apparatus 610 may be stored in the memory device 6001c based on data received from the measuring apparatus 609. In this case, when the host apparatus 601 is controlled and for example, the insulating film forming apparatus 610 is a plurality, since it is appropriately selected by a condition including a transferring rate and the like, processing efficiency can be increased.

Also, in the present embodiment, the other processes of the second insulating film forming process are described, but needless to say that the present invention is not limited to these processes or apparatuses or the systems.

Also, the case in which the wafer 200 is divided into the center portion and the peripheral portion is described, but the present invention is not limited thereto. The thickness of the insulating film may be controlled in regions more segmented than the two regions of the center of the substrate and the periphery thereof. For example, the wafer 200 may be divided into three or more regions such as the center of the substrate, the peripheral portion thereof and a surface between the center of the substrate and the peripheral portion thereof Also, in the present embodiment, the process of measuring the thickness of the film (S110) is performed, but the present invention is not limited thereto, and the process of measuring the thickness of the film (S110) may not be performed. In this case, the height of the film in which the insulating film 2015 is stacked on the insulating film 2013 may be matched within a range having no variation in the characteristics of the via.

Also, in a process of forming a film, a film forming process such as a chemical vapor deposition (CVD), a cyclic process in which gases are alternately supplied to form a thin film, oxidizing for modifying a film, nitriding or oxynitriding may be performed. According to such a process, even when it is not possible to reduce the unevenness, the compensation may be performed.

Also, when a sputter process or a film forming process is performed, an isotropic process and an anisotropic process may be combined therein. By combining the isotropic process and the anisotropic process, a more precise compensation may be performed.

Also, although the silicon oxide film is used as the insulating film, it may be sufficient for the purpose thereof to be achieved, and the pattern may be formed of a film that combines an oxide film, a nitride film, a carbide film, an oxynitride film and the like which contain other elements.

Also, in the above description, although one process of the processes of manufacturing the semiconductor device is described, the process is not limited thereto. It is also possible to apply to a technique for processing the substrate such as a patterning process in a liquid crystal panel manufacturing process, a patterning process in a solar cell manufacturing process, a patterning process in a power device manufacturing process or the like.

Also, in the above description, the controller 260 controls the first gas supply system and the second gas supply system and controls the center-zone heater 213a, the outer-zone heater 213b, so that the amount of exposure to gas per unit area is changed according to the distribution of the first insulating film, but the present invention is not limited thereto. For example, when it is difficult to change the amount or the concentration of the gas in the gas supply unit, the controller 260 may control the first gas supply system, the second gas supply system, the center-zone heater 213a and the outer-zone heater 213b, so that a supply amount of the first gas supply system is the same as that of the second gas supply system and a temperature of the center-zone heater 213a is different from that of the outer-zone heater 213b.

Also, in the above description, different apparatuses are used in the first insulating film forming process, the second insulating film forming process and the third insulating film forming process, but the present invention is not limited thereto. For example, the first insulating film forming process may be performed by the substrate processing apparatus 900.

Also, the above description is made using the wafer having a thickness of 300 mm, but the present invention is not limited thereto. For example, a large substrate such as a wafer having a thickness of 450 mm or the like is more effective. In the case of the large substrate, the influence on the insulating film polishing process (S107) is more significantly increased. That is, a difference between the thickness of the insulating film 2013a and the thickness of the insulating film 2013b is further increased. By performing the second insulating film forming process, the variation in the characteristic may be suppressed even on the large substrate.

According to the technique of the present invention, the variation in the characteristic of the semiconductor device can be suppressed.

What is claimed is:

1. A method of manufacturing a semiconductor device, comprising:
    (a) polishing a substrate including: a first insulating film having a first groove; and a first metal film formed in the first groove and on the first insulating film;
    (b) forming a second insulating film on the substrate after performing (a);
    (c) polishing the second insulating film;
    (d) measuring a thickness distribution of the second insulating film on the substrate after performing (c); and
    (e) forming a third insulating film having a thickness distribution different from that of the second insulating film measured in (d) to compensate for a thickness distribution of a stacked insulating film including the second insulating film and the third insulating film.

2. The method of claim 1, further comprising:
(f) patterning the stacked insulating film after performing (e) to form a through-hole therein;
(g) forming a second groove where a second metal film is to be filled at an upper portion of the through-hole after performing (f); and
(h) forming a via at a lower portion of the through-hole after performing (g).

3. The method of claim 2, wherein the substrate further comprises a first barrier film formed between the first groove and the first metal film, and, in (e), the substrate is heated to a temperature whereat a film density of the first barrier film is not degraded.

4. The method of claim 2, further comprising: (i) forming a second barrier film on the first insulating film and the first metal film between (a) and (b), and wherein, in (e), the substrate is heated to a temperature whereat the second barrier film is not degraded.

5. The method of claim 2, wherein the first metal film and the second metal film are electrically connected through the via.

6. The method of claim 2, wherein an amount of exposure to a main component of a process gas per unit area of a peripheral portion of the substrate is smaller than an amount of exposure to the main component of the process gas per unit area of a center portion of the substrate in (e) when the thickness distribution of the second insulating film measured in (d) indicates a portion of the second insulating film at the peripheral portion is thicker than a portion of the second insulating film at the center portion.

7. The method of claim 2, wherein a temperature of a center portion of the substrate is higher than a temperature of a peripheral portion of the substrate in (e) when the thickness distribution of the second insulating film measured in (d) indicates a portion of the second insulating film at the peripheral portion is thicker than a portion of the second insulating film at the center portion.

8. The method of claim 2, wherein an amount of exposure to a main component of a process gas per unit area of a peripheral portion of the substrate is greater than an amount of exposure to the main component of the process gas per unit area of a center portion of the substrate in (e) when the thickness distribution of the second insulating film measured in (d) indicates a portion of the second insulating film at the peripheral portion is thinner than a portion of the second insulating film at the center portion.

9. The method of claim 2, wherein a temperature of a peripheral portion of the substrate is higher than a temperature of a central portion of the substrate in (e) when the thickness distribution of the second insulating film measured in (d) indicates a portion of the second insulating film at the peripheral portion is thinner than a portion of the second insulating film at the center portion.

10. The method of claim 1, wherein an amount of exposure to a main component of a process gas per unit area of a peripheral portion of the substrate is smaller than an amount of exposure to the main component of the process gas per unit area of a center portion of the substrate in (e) when the thickness distribution of the second insulating film measured in (d) indicates a portion of the second insulating film at the peripheral portion is thicker than a portion of the second insulating film at the center portion.

11. The method of claim 1, wherein an amount of a process gas supplied to a peripheral portion of the substrate is smaller than an amount of the process gas supplied to a center portion of the substrate in (e) when the thickness distribution of the second insulating film measured in (d) indicates a portion of the second insulating film at the peripheral portion is thicker than a portion of the second insulating film at the center portion.

12. The method of claim 1, wherein a concentration of a main component of a process gas supplied to a peripheral portion of the substrate is lower than a concentration of the main component of the process gas supplied to a center portion of the substrate in (e) when the thickness distribution of the second insulating film measured in (d) indicates a portion of the second insulating film at the peripheral portion is thicker than a portion of the second insulating film at the center portion.

13. The method of claim 12, wherein an amount of an inert gas added to the process gas supplied to the peripheral portion is greater than an amount of the inert gas added to the process gas supplied to the center portion.

14. The method of claim 1, wherein a temperature of a center portion of the substrate is higher than a temperature of a peripheral portion of the substrate in (e) when the thickness distribution of the second insulating film measured in (d) indicates a portion of the second insulating film at the peripheral portion is thicker than a portion of the second insulating film at the center portion.

15. The method of claim 1, wherein an amount of exposure to a main component of a process gas per unit area of a peripheral portion of the substrate is greater than an amount of exposure to the main component of the process gas per unit area of a center portion of the substrate in (e) when the thickness distribution of the second insulating film measured in (d) indicates a portion of the second insulating film at the peripheral portion is thinner than a portion of the second insulating film at the center portion.

16. The method of claim 1, wherein an amount of a process gas supplied to a peripheral portion of the substrate is greater than an amount of the process gas supplied to a center portion of the substrate in (e) when the thickness distribution of the second insulating film measured in (d) indicates a portion of the second insulating film at the peripheral portion is thinner than a portion of the second insulating film at the center portion.

17. The method of claim 1, wherein a concentration of a main component of a process gas supplied to a peripheral portion of the substrate is higher than a concentration of the main component of the process gas supplied to a center portion of the substrate in (e) when the thickness distribution of the second insulating film measured in (d) indicates a portion of the second insulating film at the peripheral portion is thinner than a portion of the second insulating film at the center portion.

18. The method of claim 17, wherein an amount of an inert gas added to the process gas supplied to the center portion is greater than an amount of the inert gas added to the process gas supplied to the peripheral portion.

19. The method of claim 1, wherein a temperature of a peripheral portion of the substrate is higher than a temperature of a center portion of the substrate in (e) when the thickness distribution of the second insulating film measured in (d) indicates a portion of the second insulating film at the peripheral portion is thinner than a portion of the second insulating film at the center portion.

20. A method of manufacturing a semiconductor device, comprising:
(a) placing a substrate having a polished surface on a substrate support accommodated in a process chamber, the substrate including: a first insulating film having a first groove; a first metal film formed in the first groove; and a second insulating film formed on the first insulating film and the first metal film;
(b) receiving a thickness distribution of the second insulating film on the substrate; and
(c) forming a third insulating film having a thickness distribution different from that of the second insulating film measured in (b) to compensate for a thickness distribution of a stacked insulating film including the second insulating film and the third insulating film.

* * * * *